United States Patent
Kodama

(10) Patent No.: US 10,867,798 B2
(45) Date of Patent: *Dec. 15, 2020

(54) METHOD OF MANUFACTURING SEMICONDUCTOR DEVICE

(71) Applicant: FUJI ELECTRIC CO., LTD., Kawasaki (JP)

(72) Inventor: Naoko Kodama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/523,596

(22) Filed: Jul. 26, 2019

(65) Prior Publication Data

US 2019/0348289 A1    Nov. 14, 2019

Related U.S. Application Data

(63) Continuation-in-part of application No. 16/201,363, filed on Nov. 27, 2018, now Pat. No. 10,629,441, (Continued)

(30) Foreign Application Priority Data

Dec. 8, 2016 (JP) ................................ 2016-238914

(51) Int. Cl.
*H01L 21/266* (2006.01)
*H01L 29/66* (2006.01)

(52) U.S. Cl.
CPC ........ *H01L 21/266* (2013.01); *H01L 29/6609* (2013.01); *H01L 29/66325* (2013.01)

(58) Field of Classification Search
None
See application file for complete search history.

(56) References Cited

U.S. PATENT DOCUMENTS

| 6,870,199 B1 | 3/2005 | Yoshikawa et al. |
| 10,629,441 B2 * | 4/2020 | Kodama ............... H01L 21/266 |

(Continued)

FOREIGN PATENT DOCUMENTS

| JP | 6-262124 A | 9/1994 |
| JP | 8195337 A | 7/1996 |

(Continued)

OTHER PUBLICATIONS

Non-final Office Action dated Sep. 18, 2019 in co-pending U.S. Appl. No. 16/201,363.

(Continued)

*Primary Examiner* — Asok K Sarkar

(57) ABSTRACT

A photoresist is applied to a front surface of a semiconductor wafer rotating at a predetermined rotational speed and a photoresist film having a predetermined thickness is formed and dried. Next, a chemical is dripped while the semiconductor wafer is rotated at the predetermined rotational speed or less, whereby an edge part of the photoresist film is dissolved and removed by the chemical while the predetermined thickness of the photoresist film is maintained. A predetermined pattern is transferred to the photoresist film by exposure and development. After the development, without performing UV curing or post-bake, the photoresist film is used as a mask and helium irradiation having a range of 8 μm or greater from the front surface of the semiconductor wafer is performed. Thus, a predetermined impurity may be implanted with good positioning accuracy in a predetermined region, using the photoresist film as a mask and cost may be reduced.

19 Claims, 19 Drawing Sheets

Related U.S. Application Data which is a continuation of application No. PCT/JP2017/040334, filed on Nov. 8, 2017.

(56) References Cited

U.S. PATENT DOCUMENTS

| | | |
|---|---|---|
| 2013/0260515 A1 | 10/2013 | Mizushima |
| 2014/0159192 A1 | 6/2014 | Kakefu |
| 2016/0329323 A1 | 11/2016 | Iwasaki et al. |
| 2017/0052450 A1 | 2/2017 | Nakagawa et al. |
| 2017/0077216 A1 | 3/2017 | Kouno |

FOREIGN PATENT DOCUMENTS

| | | |
|---|---|---|
| JP | 2001135831 A | 5/2001 |
| JP | 2004363328 A | 12/2004 |
| JP | 2008103660 A | 5/2008 |
| JP | 2008192737 A | 8/2008 |
| JP | 2010-93049 A | 4/2010 |
| JP | 2014135476 A | 7/2014 |
| JP | 2015118991 A | 6/2015 |
| JP | 2015-170617 A | 9/2015 |
| WO | 2008140083 A1 | 11/2008 |
| WO | 2015145929 A1 | 10/2015 |

OTHER PUBLICATIONS

International Search Report dated Dec. 19, 2017 in corresponding International Application No. PCT/JP2017/040334.

Written Opinion of the International Searching Authority dated Dec. 19, 2017 in corresponding International Application No. PCT/JP2017/040334.

Notice of Reasons for Refusal dated Jun. 2, 2020, in Japanese Patent Application No. 2018-554873, with machine translation (6 pages total).

* cited by examiner

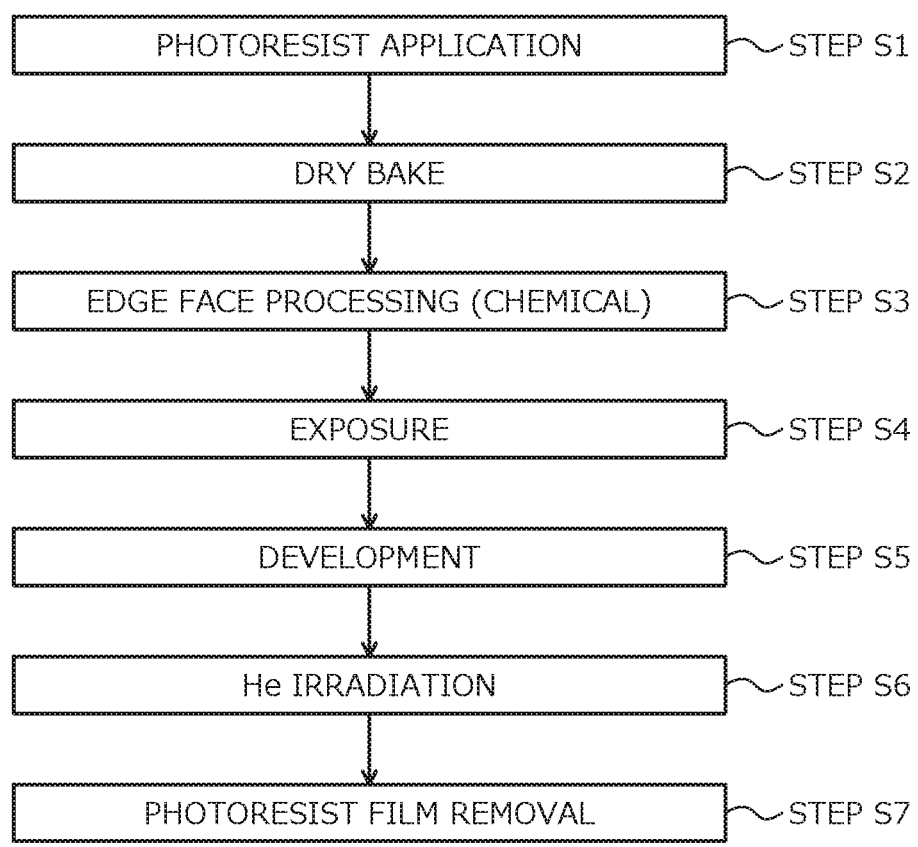

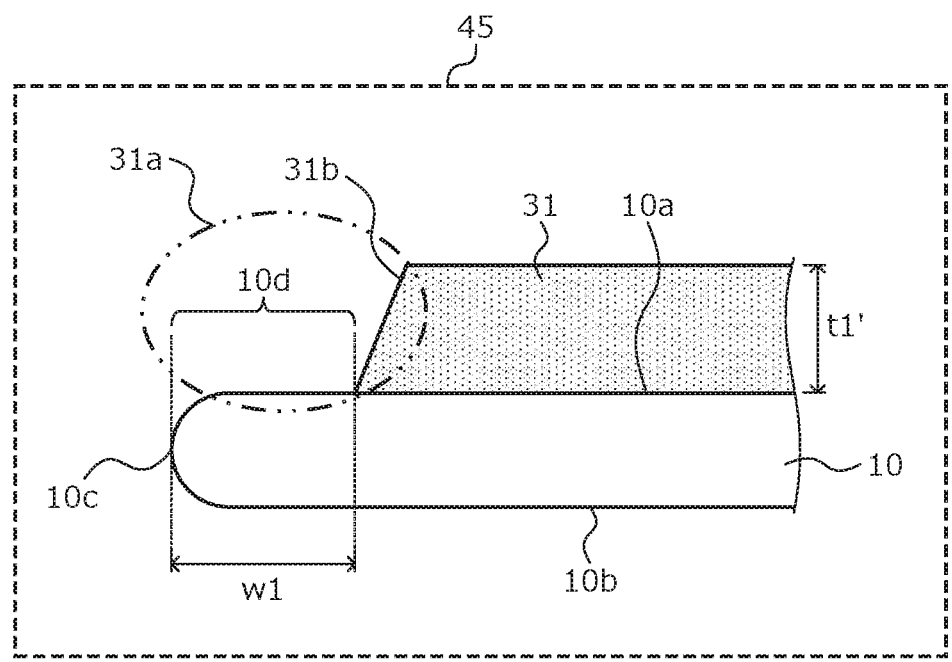

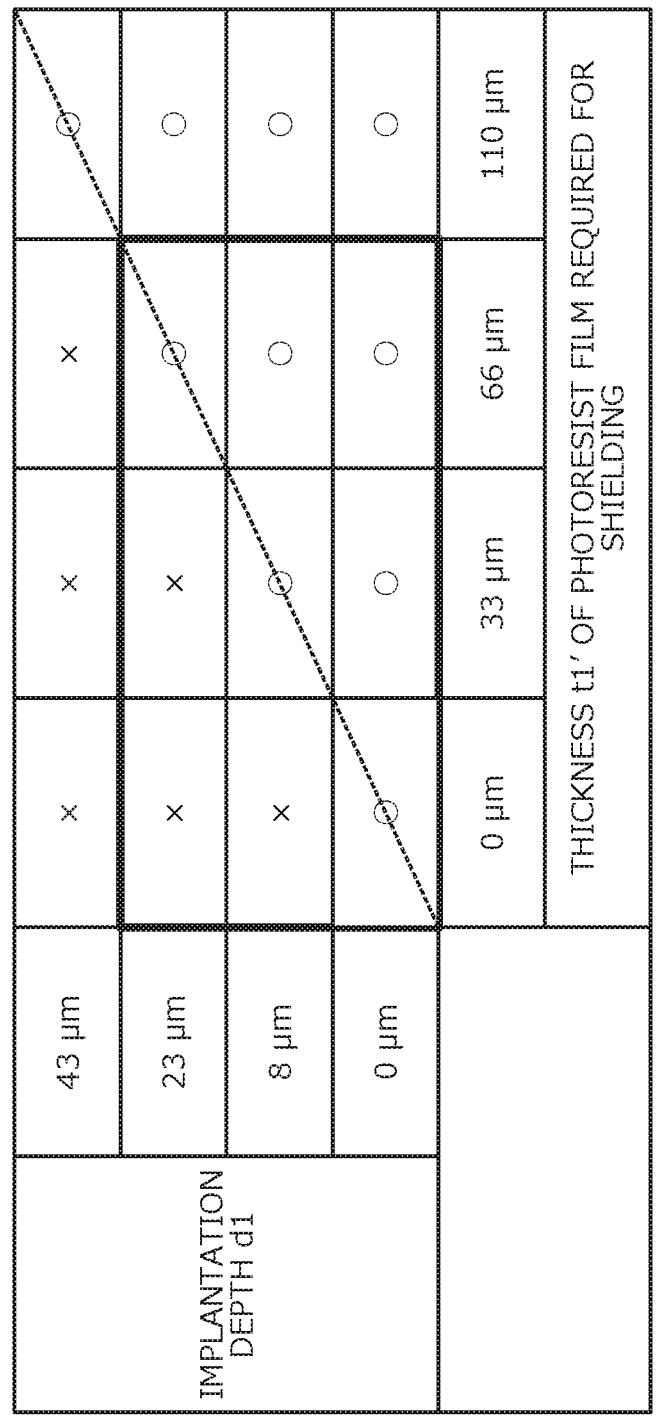

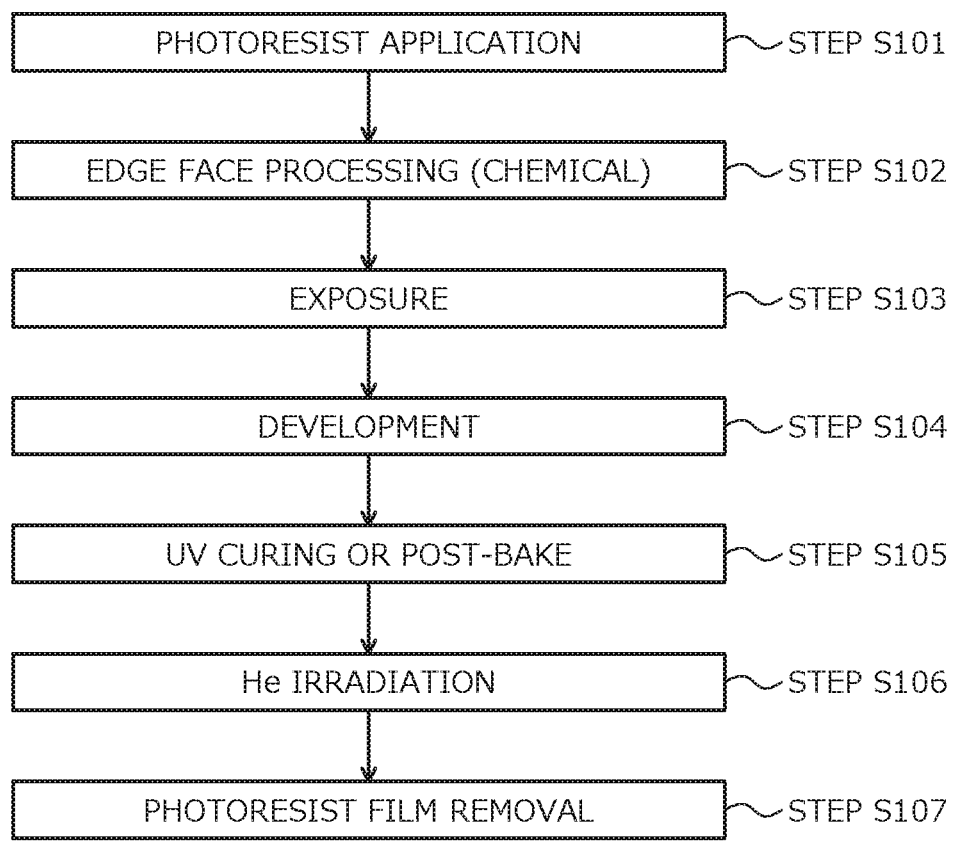

METHOD OF MANUFACTURING SEMICONDUCTOR DEVICE

CROSS REFERENCE TO RELATED APPLICATIONS

This non-provisional application is a continuation-in-part of U.S. application Ser. No. 16/201,363 filed Nov. 27, 2018 and is based upon International Application PCT/JP2017/040334, filed on Nov. 8, 2017 which claims priority from a Japanese Patent Application No. 2016-238914 filed on Dec. 8, 2016, and designating the U.S., the entire contents of which are incorporated herein by reference.

BACKGROUND

1. Field

Embodiments of the invention relate to a method of manufacturing a semiconductor device.

2. Description of Related Art

Conventionally, power devices are being developed to enhance characteristics and improve characteristics by introducing through ion implantation at a high acceleration energy, impurity defects that become lifetime killers. For example, in a known reverse conducting IGBT (RC-IGBT) having a structure in which an insulated gate bipolar transistor (IGBT) and a free wheeling diode (FWD) connected in antiparallel with the IGBT are integrated and built into a single semiconductor chip, helium (He) is irradiated and defects that become a lifetime killer are formed in an n$^-$-type drift region.

FIGS. 13 and 14 are cross-sectional views depicting a structure of a conventional RC-IGBT. In the conventional RC-IGBT depicted in FIG. 13, near an interface of an n$^-$-type drift region 101 and a p-type base region 102, defects 113 are formed by helium irradiation. The defects 113 are formed not only in a FWD region 112, but also in an IGBT region 111. The IGBT region 111 is a region in which an IGBT is disposed. The FWD region 112 is a region in which a FWD is disposed. Further, as depicted in FIG. 14, to reduce leak current and loss in the IGBT region 111, a RC-IGBT has been proposed in which defects 114 are formed only in the FWD region 112 (for example, refer to Japanese Laid-Open Patent Publication No. 2015-118991, Japanese Laid-Open Patent Publication No. 2008-192737, and Japanese Laid-Open Patent Publication No. 2014-135476).

In fabricating (manufacturing) such a RC-IGBT, in a selectively formed diffusion region such as an n$^+$-type emitter region 103 or a p$^+$-type contact region 104, ion implantation 122 of an impurity is performed with respect to a semiconductor wafer 110 using, as a mask (shielding film), a photoresist film 121 opened at parts corresponding to respective regions (FIG. 15). FIG. 15 is a cross-sectional view schematically depicting a state during ion implantation using a photoresist film as a mask. The photoresist film 121 is formed having a thickness t101 that corresponds to a range of the impurity of the ion implantation 122; ordinarily, phosphorus (P), boron (B), arsenic (As), etc. is implanted by the ion implantation 122. Further, the photoresist film 121 is removed by an ashing process (ashing) after the ion implantation 122.

Japanese Laid-Open Patent Publication No. 2008-192737 (paragraphs 0025 to 0027) discloses selectively irradiating helium at a predetermined depth in a semiconductor wafer, using a mask opened only at a part corresponding to the FWD region. Japanese Laid-Open Patent Publication No. 2014-135476 (paragraph 0045) discloses selectively irradiating helium with respect to a semiconductor wafer using, as a shielding film, a photoresist film having a predetermined pattern. Further, according to a known method, when a depth (range) of implantation (irradiation) 132 of an impurity such as with helium irradiation or proton (H$^+$) irradiation at a high acceleration energy is deep and the photoresist film does not function as a shielding film, a hard mask 131 such as a metal mask or a silicon (Si) is used (FIG. 16).

FIGS. 16 and 17 are cross-sectional views schematically depicting a state of an ion implantation process using a hard mask as a mask. As depicted in FIG. 16, when the hard mask 131 is used as a shielding film for ion implantation of an impurity, the semiconductor wafer 110 and the hard mask 131 are aligned using, as a reference, an alignment mark formed on the semiconductor wafer 110 in advance, and both are fixed by, for example, a chip or screw (not depicted) so that opposing main surfaces do not contact. With the semiconductor wafer 110 and the hard mask 131 in a fixed state, implantation 132 of an impurity at a high acceleration energy is performed from the hard mask 131 side, whereby defects and impurity of a predetermined ion type are introduced only in a predetermined region.

For example, a state during manufacture when, in the RC-IGBT, the defects 114 are introduced only in the FWD region 112 by helium irradiation is depicted in FIG. 17. As depicted in FIG. 17, after element structures of the IGBT and the FWD are formed in the semiconductor wafer 110, the hard mask 131 is fixed to the semiconductor wafer 110 by, for example, a clip or screw (not depicted) so at to oppose a rear surface (surface on a p$^1$-type collector region 105 side) of the semiconductor wafer 110. Thereafter, helium is irradiated from the rear surface of the semiconductor wafer 110 using the hard mask 131 as a mask, whereby from an opening 131a of the hard mask 131, the defects 114 are introduced only in the FWD region 112 by helium irradiation.

SUMMARY

According to an embodiment of the present invention, a method of manufacturing a semiconductor device, includes applying a photoresist to a first main surface of a semiconductor wafer and forming a photoresist film; opening a predetermined site of the photoresist film and forming a resist mask; and using the resist mask as a mask, and performing ion implantation of an impurity by an acceleration energy so that a range is at least 8 μm from the first main surface of the semiconductor wafer.

In the embodiment, forming the photoresist film includes forming the photoresist film to have a predetermined thickness along the first main surface of the semiconductor wafer overall. The method further includes drying the photoresist film by heat treatment after forming the photoresist film and before forming the resist mask; and dissolving and removing by a chemical, a part having a predetermined width from an edge part of the photoresist film, the part being dissolved and removed over an entire periphery of the edge part of the photoresist film, after drying the photoresist film.

In the embodiment, forming the photoresist film includes forming the photoresist film to have the predetermined thickness by spreading the photoresist on the first main surface of the semiconductor wafer overall by rotating the semiconductor wafer around a central axis at a predetermined rotational speed, the central axis being orthogonal to the first main surface of the semiconductor wafer. Dissolving and removing the part includes dripping the chemical on the edge part of the photoresist film while the semiconductor wafer is rotated around the central axis at a rotational speed that is the predetermined rotational speed or slower, and applying the chemical over the entire periphery of the edge part of the photoresist film.

In the embodiment, a thickness of the photoresist film is 30 µm or more.

In the embodiment, the thickness of the photoresist film is at most 1.5 times a thickness of the semiconductor wafer.

In the embodiment, the acceleration energy of the ion implantation is 3.0 MeV or higher.

In the embodiment, the impurity is helium.

In the embodiment, the impurity is protons.

In the embodiment, a dose amount of the ion implantation is $1 \times 10^{15}/cm^2$ or less. The acceleration energy of the ion implantation is 5 MeV or less. Performing the ion implantation is performed after forming the resist mask without an interposed process in between.

In the embodiment, forming the resist mask includes transferring and exposing a predetermined mask pattern to the photoresist film, and developing by selectively dissolving the photoresist film based on the mask pattern and opening the predetermined site of the photoresist film. Performing the ion implantation is performed after the developing, without an interposed process in between.

In the embodiment, the photoresist used is chemically amplified.

In the embodiment, the photoresist used is a positive-type.

In the embodiment, the photoresist used is a negative type.

In the embodiment, the method further includes forming a first semiconductor element in a first region of the semiconductor wafer and forming a second semiconductor element in a second region of the semiconductor wafer. The predetermined site of the photoresist film is a site that corresponds to a formation region of the second region.

In the embodiment, the first semiconductor element is an insulated-gate bipolar transistor. The second semiconductor element is a diode. Forming the first semiconductor element and forming the second semiconductor element include forming in a surface layer of the first main surface of the semiconductor wafer of a first conductivity type, a second-conductivity-type semiconductor region constituting a base region of the insulated-gate bipolar transistor and an anode region of the diode. Performing the ion implantation includes implanting the impurity near an interface of the semiconductor wafer with the second-conductivity-type semiconductor region, from the first main surface of the semiconductor wafer.

In the embodiment, forming the first semiconductor element and forming the second semiconductor element includes forming an interlayer insulating film on the first main surface of the semiconductor wafer. Performing the ion implantation is performed before forming the interlayer insulating film.

In the embodiment, the first semiconductor element is an insulated-gate bipolar transistor. The second semiconductor element is a diode. Forming the first semiconductor element and forming the second semiconductor element includes forming in a surface layer of a second main surface of the semiconductor wafer of a first conductivity type, a second-conductivity-type semiconductor region constituting a base region of the insulated-gate bipolar transistor and an anode region of the diode. Performing the ion implantation includes implanting the impurity near an interface of the semiconductor wafer with the second-conductivity-type semiconductor region, the impurity being implanted from the first main surface of the semiconductor wafer.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a flowchart depicting an outline of some processes of a method of manufacturing the semiconductor device according to the embodiment.

FIG. 4B is a cross-sectional view of the semiconductor device according to the embodiment during manufacture.

FIG. 8 is a characteristics diagram depicting a relationship of helium implantation depth and thickness of the photoresist film.

FIG. 10 is a flowchart depicting an outline of some processes of a conventional method of manufacturing a semiconductor device.

DESCRIPTION OF EMBODIMENTS

Figure 1:
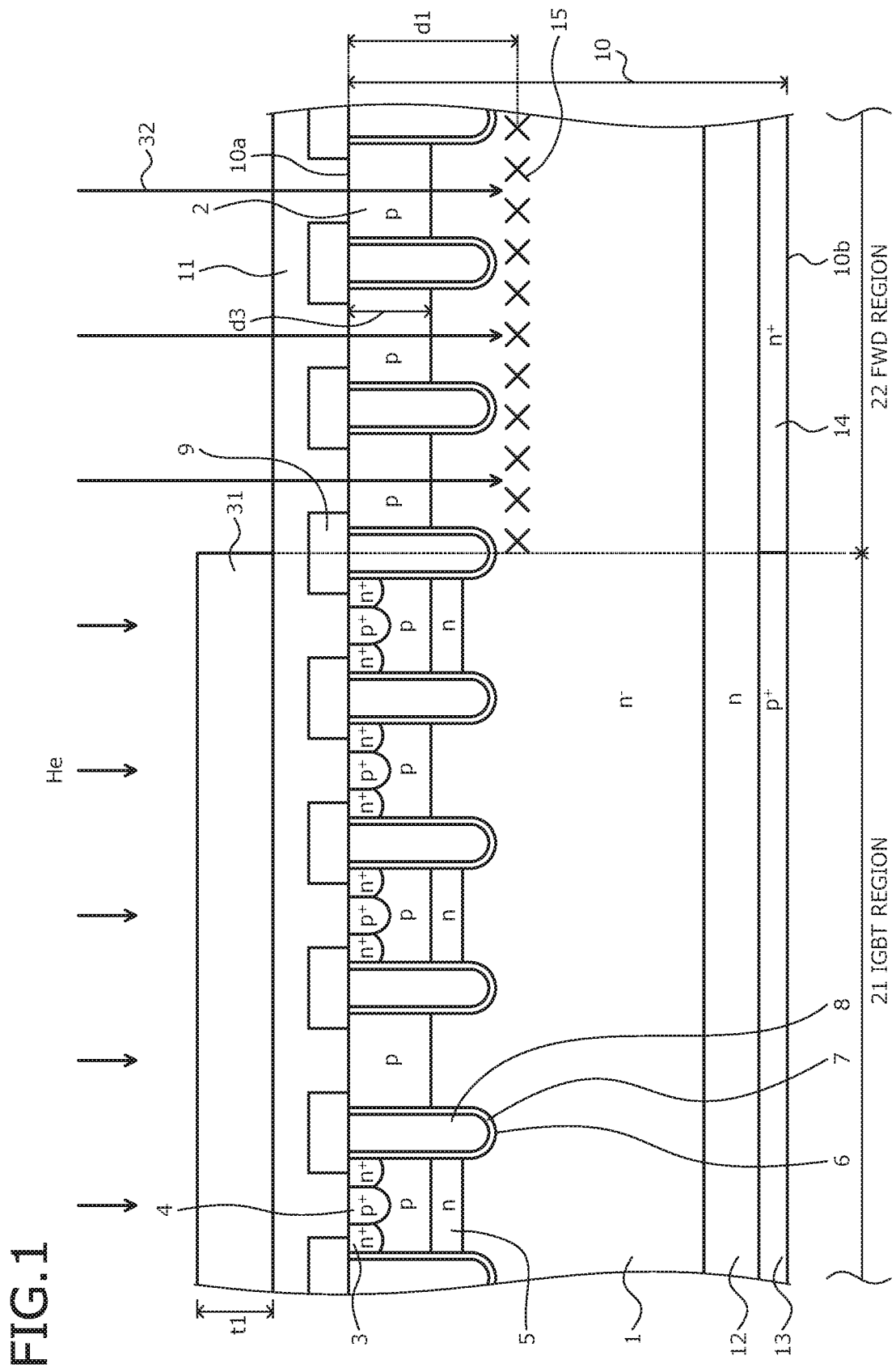
FIG. 1 is a cross-sectional view of a semiconductor device according to an embodiment during manufacture.

Nonetheless, since the hard mask 131 is mechanically processed such as by cutting or wire cutting, positioning accuracy of the opening 131a is inferior. Further, a minimum processing size of the opening 131a of the hard mask 131 is large at about 300 µm and therefore, size reductions of semiconductor regions are difficult and use may be impossible due to device dimensions. Further, alignment precision of the semiconductor wafer 110 and the hard mask 131 is about ±50 µm, and is inferior compared to the alignment precision (about ±1.5 µm) of the photoresist film 121 formed by photolithography. Therefore, a large design margin is necessary, increasing the chip size, whereby the number of chips that may be cut from one semiconductor wafer decreases, increasing the cost.

On the other hand, when the photoresist film 121 is used as a shielding film and the depth of an impurity of the ion implantation 122 is deep, as described above, the photoresist film 121 has to be formed having the thickness t101 that corresponds to the range of the impurity implanted by the ion implantation 122. For example, assuming the range in the photoresist film 121 is twice the range in the semiconductor wafer 110, in this case, when the depth of the impurity of the ion implantation 122 in semiconductor wafer 110 is 0.5 µm, the thickness t101 of the photoresist film 121 is 1.0 µm. However, when the depth of the impurity of the ion implantation 122 in the semiconductor wafer 110 is deep at, for example, 50 µm such as with helium irradiation or proton ($H^+$) irradiation, the thickness t101 of the photoresist film 121 has to be at least 100 µm.

Figure 11A:
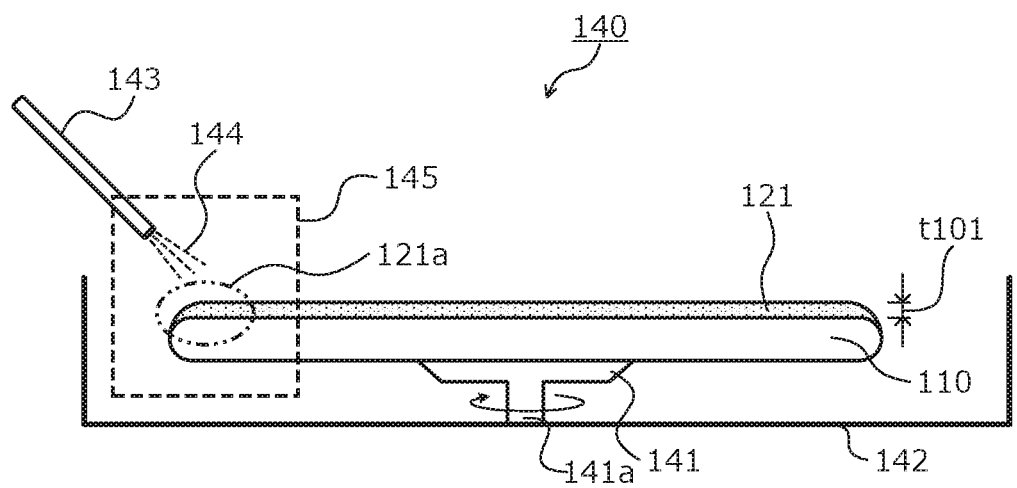
FIG. 11A is a cross-sectional view of a conventional resist mask during manufacture.
Figure 11B:
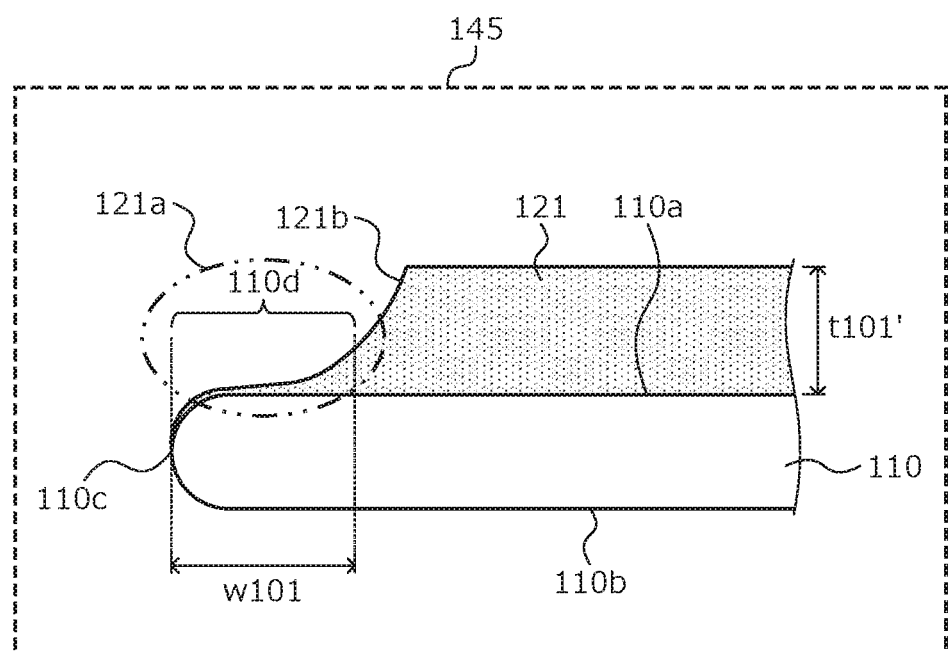
FIG. 11B is a cross-sectional view of the conventional resist ask during manufacture.

Thus, when the thickness t101 of the photoresist film (resist mask) 121 is used as a shielding film, the following problem arises. FIG. 10 is a flowchart depicting an outline of some processes of a conventional method of manufacturing a semiconductor device. FIGS. 11A and 11B are cross-sectional views of a conventional resist mask during manufacture. In general, when the photoresist film 121 is formed, first, the semiconductor wafer 110 is fixed to a rotating support base 141 of a coater (coating machine) 140. Next, after a photoresist is applied to one main surface 110a of the semiconductor wafer 110 from a nozzle (not depicted), the semiconductor wafer 110 is rotated and the photoresist film 121 is formed on the one main surface 110a of the semiconductor wafer 110 and is of the predetermined thickness t101 (step S101).

Next, with the semiconductor wafer 110 in a rotating state, a chemical 144 is dripped on an edge part of the photoresist film 121, from the edge part of the photoresist film 121, and a part 121a having a predetermined width w101 is dissolved and removed over the entire periphery of the edge part of the photoresist film 121 (step S102). FIG. 11B depicts an enlarged view of a vicinity 145 of the edge part of the photoresist film 121. At step S102, an entire periphery of a peripheral part 110d of the semiconductor wafer 110 is exposed (hereinafter, edge face processing of the semiconductor wafer 110). The peripheral part 110d of the semiconductor wafer 110 is a part constituting an inactive region that is not used as a semiconductor chip, a part sandwiched by a transport hand (not depicted) during transport of the semiconductor wafer 110, or a part in contact with side walls of a groove provided in a comb-like shape in an inner wall of a wafer cassette (not depicted).

At step S102, when the thickness t101 of the photoresist film 121 is thick, a shape of an edge face 121b collapses, the edge face 121b being newly exposed from the edge part of the photoresist film 121 when the part 121a of the predetermined width w101 dissolves. The dissolved photoresist flows outward (toward an edge part 110c of the semiconductor wafer 110). Therefore, the photoresist film 121 remains at the peripheral part 110d of the semiconductor wafer 110, covering the one main surface 110a of the semiconductor wafer 110, or covering from the one main surface 110a of the semiconductor wafer 110 to the edge part 110c, or further spanning to and covering another main surface 110b. In other words, at step S102, the part 121a having the predetermined width w101 cannot be completely removed from the edge part of the photoresist film 121 and remains covering the peripheral part 110d of the semiconductor wafer 110.

When the photoresist film 121 remains at the peripheral part 110d of the semiconductor wafer 110, after step S102, in each process performed until the photoresist film 121 is removed (step S107), the part of the photoresist film 121 remaining at the peripheral part 110d of the semiconductor wafer 110 contacts the transport hand, a receiving groove of the wafer cassette, or a stage such as that of a stepper (exposure apparatus) and as a consequence, peels and falls off. The photoresist film 121 that has peeled and fallen off becomes a generation source of particles (fine dust), whereby adhesion to the semiconductor wafer 110 and an increase in defective chips may occur. Further, the part of the photoresist film 121 remaining at the other main surface 110b of the semiconductor wafer 110 may contact and contaminate the stage of the stepper, etc.

The processes performed up to removal of the photoresist film 121 (step S107) are exposure (step S103), development (step S104), ultraviolet (UV) curing or post-bake (step S105), and helium irradiation (step S106), etc. In particular, at the exposure process, the photoresist film 121 that has peeled and fallen off adversely affects the semiconductor wafer 110 and the stepper. At step S105, a surface of the photoresist film 121 is hardened and the surface of the photoresist film 121 is prevented from being altered during helium irradiation. Reference character 141a is a rotation axis that propagates the motive power of a motor to the rotating support base 141. Reference numeral 142 is a cup (outer ring) of the coater 140 and reference numeral 143 is a nozzle that ejects the chemical 144.

Figure 12:
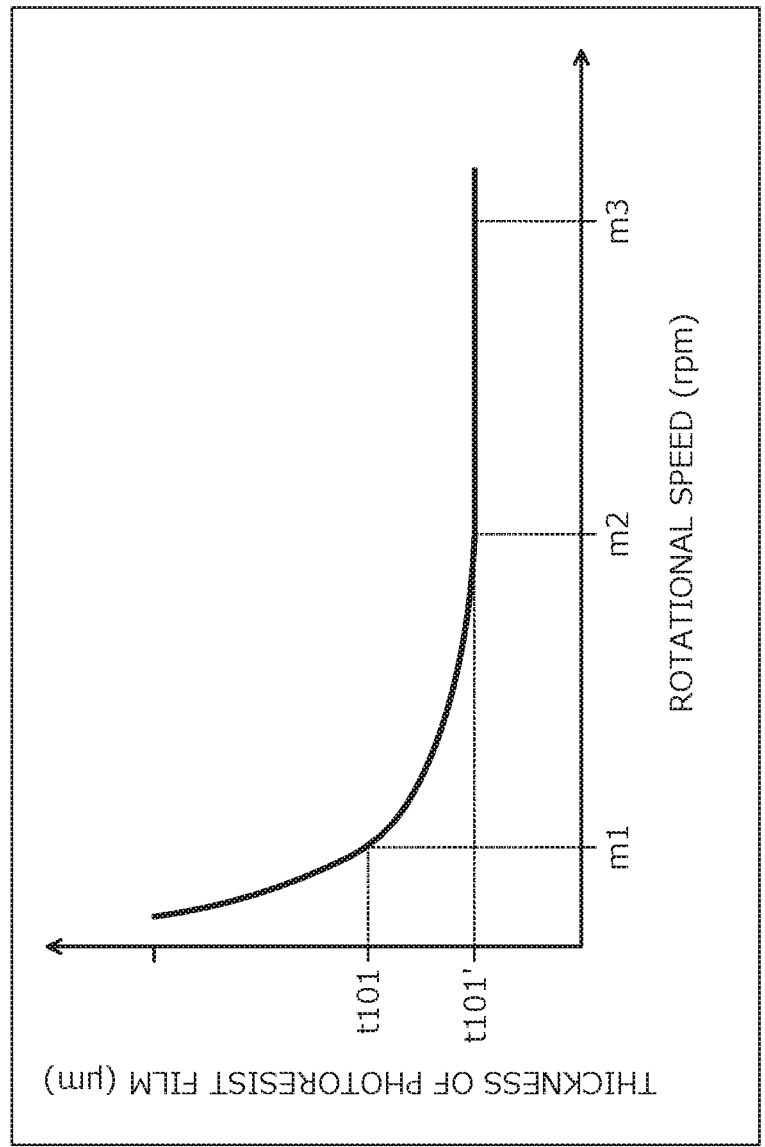
FIG. 12 is a characteristics diagram depicting a relationship of rotational speed of the semiconductor wafer and thickness of the photoresist film.
Figure 13:
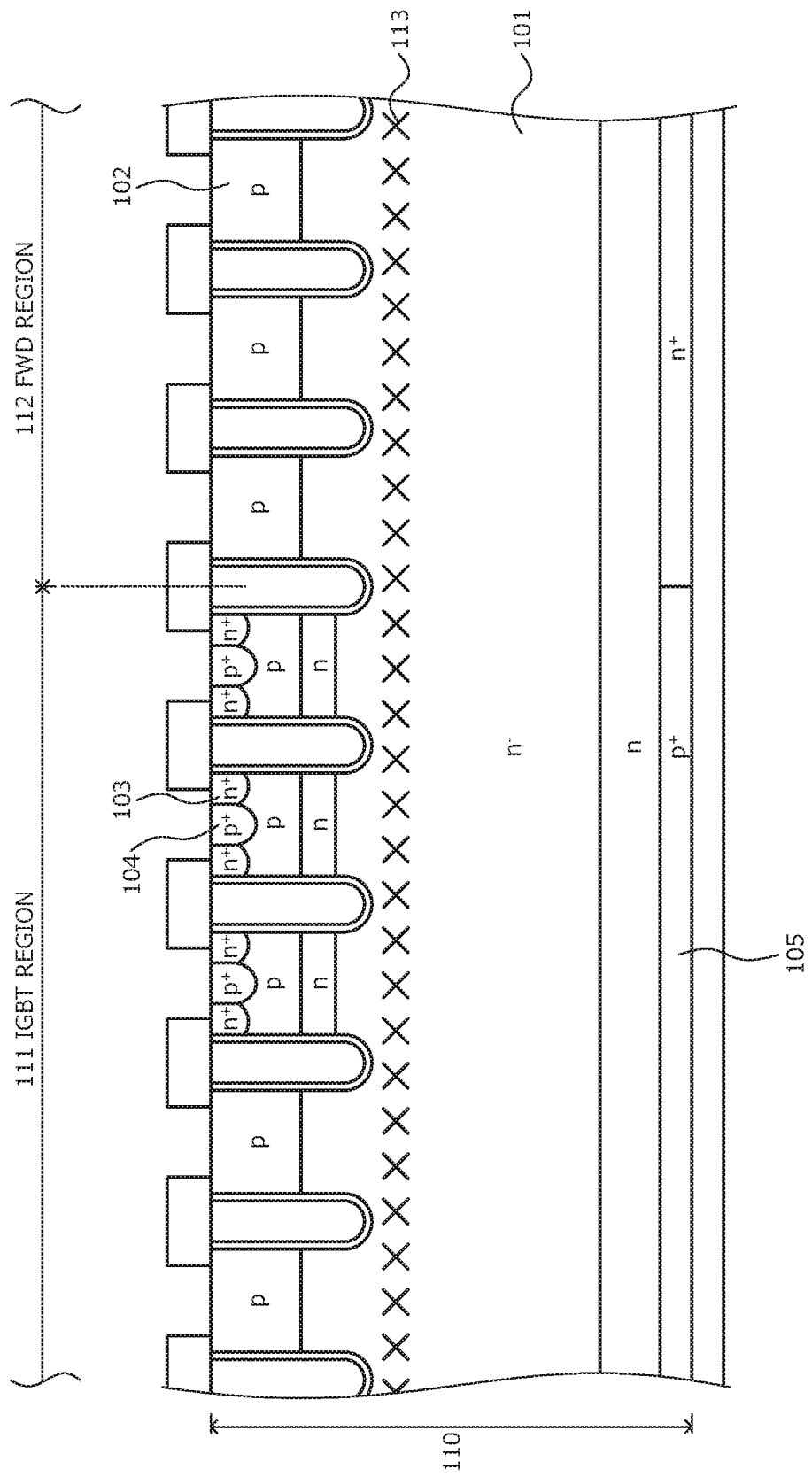
FIG. 13 is a cross-sectional view depicting a structure of a conventional RC-IGBT.
Figure 14:
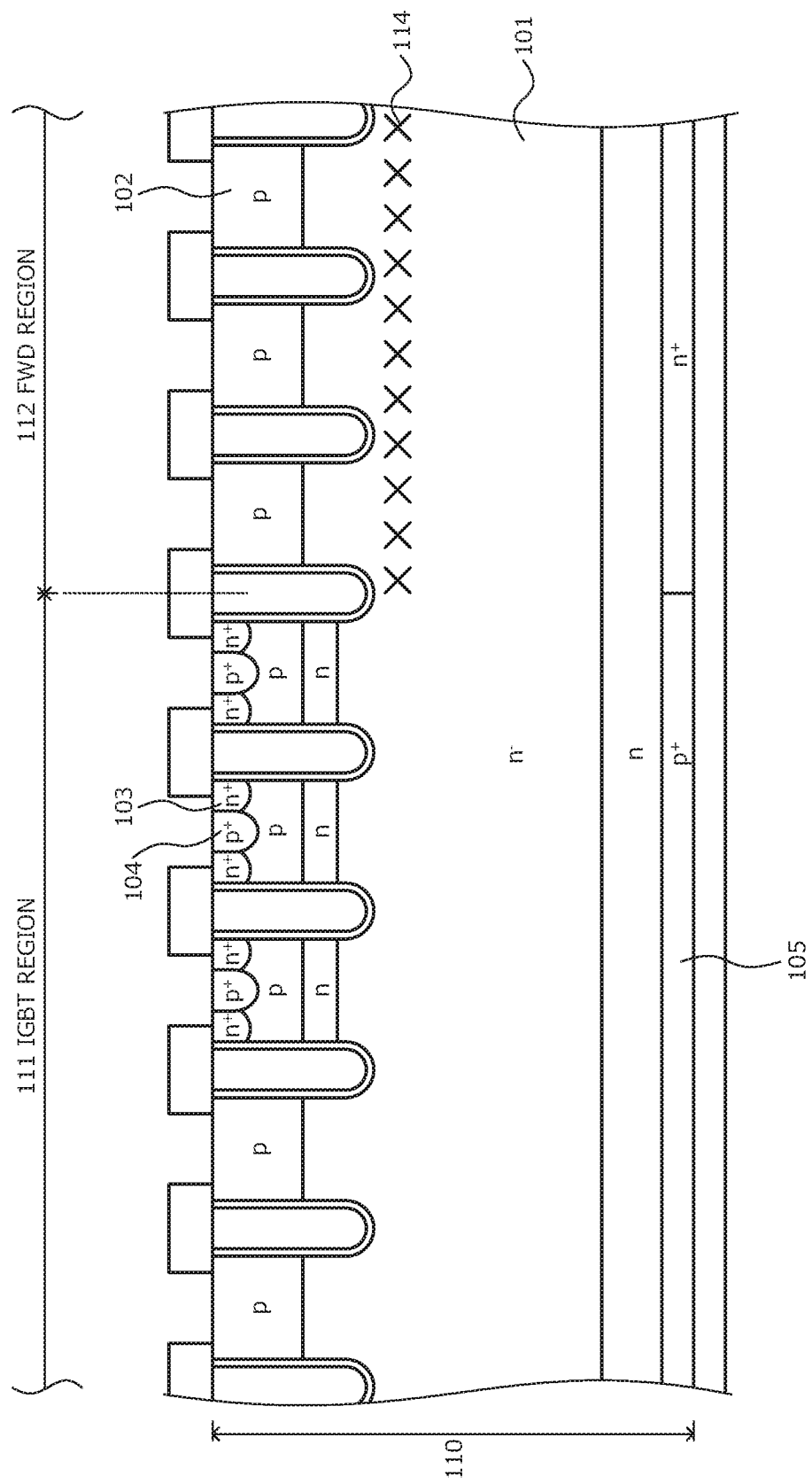
FIG. 14 is a cross-sectional view depicting a structure of a conventional RC-IGBT.
Figure 15:
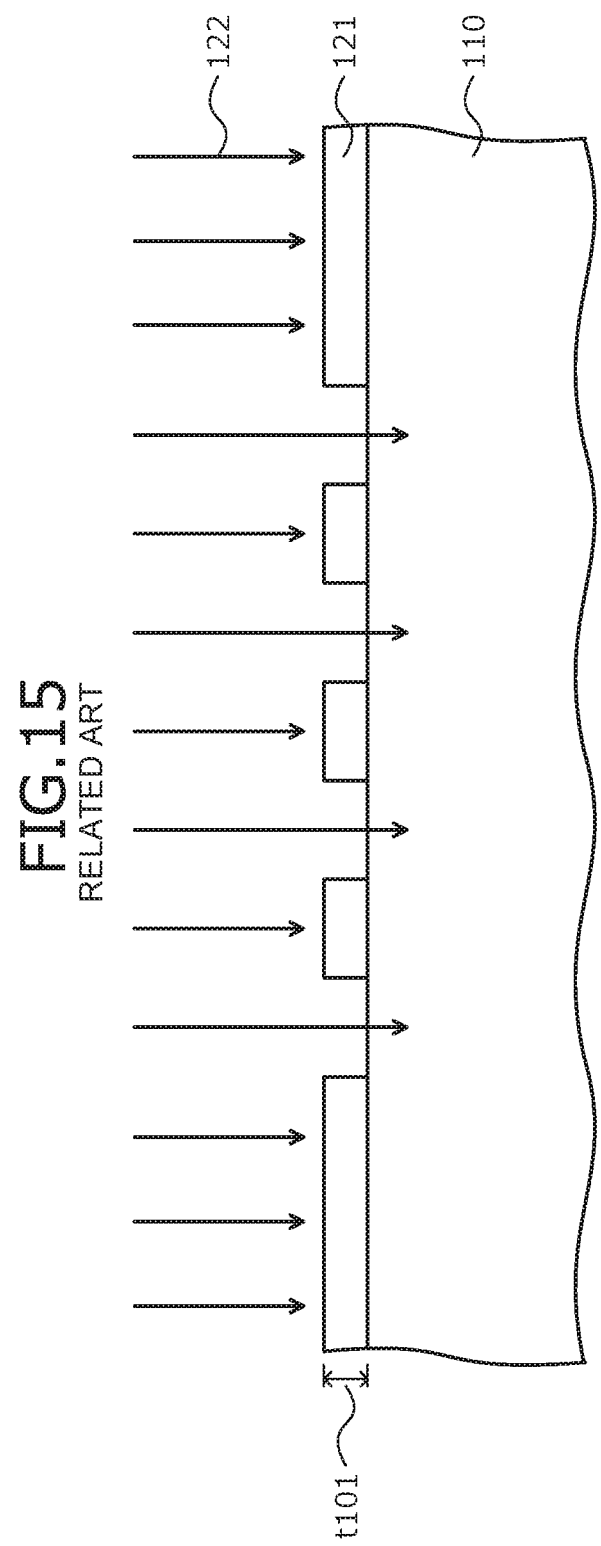
FIG. 15 is a cross-sectional view schematically depicting a state during ion implantation using a photoresist film as a mask.
Figure 16:
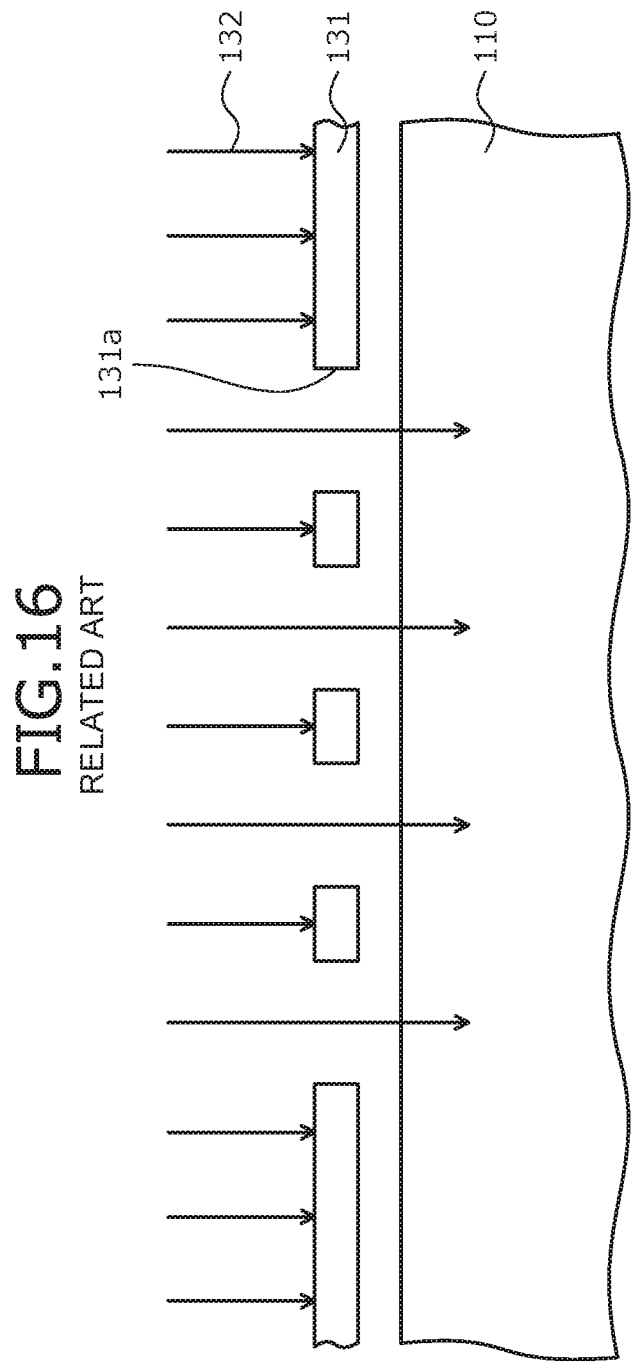
FIG. 16 is a cross-sectional view schematically depicting a state of an ion implantation process using a hard mask as a mask.
Figure 17:
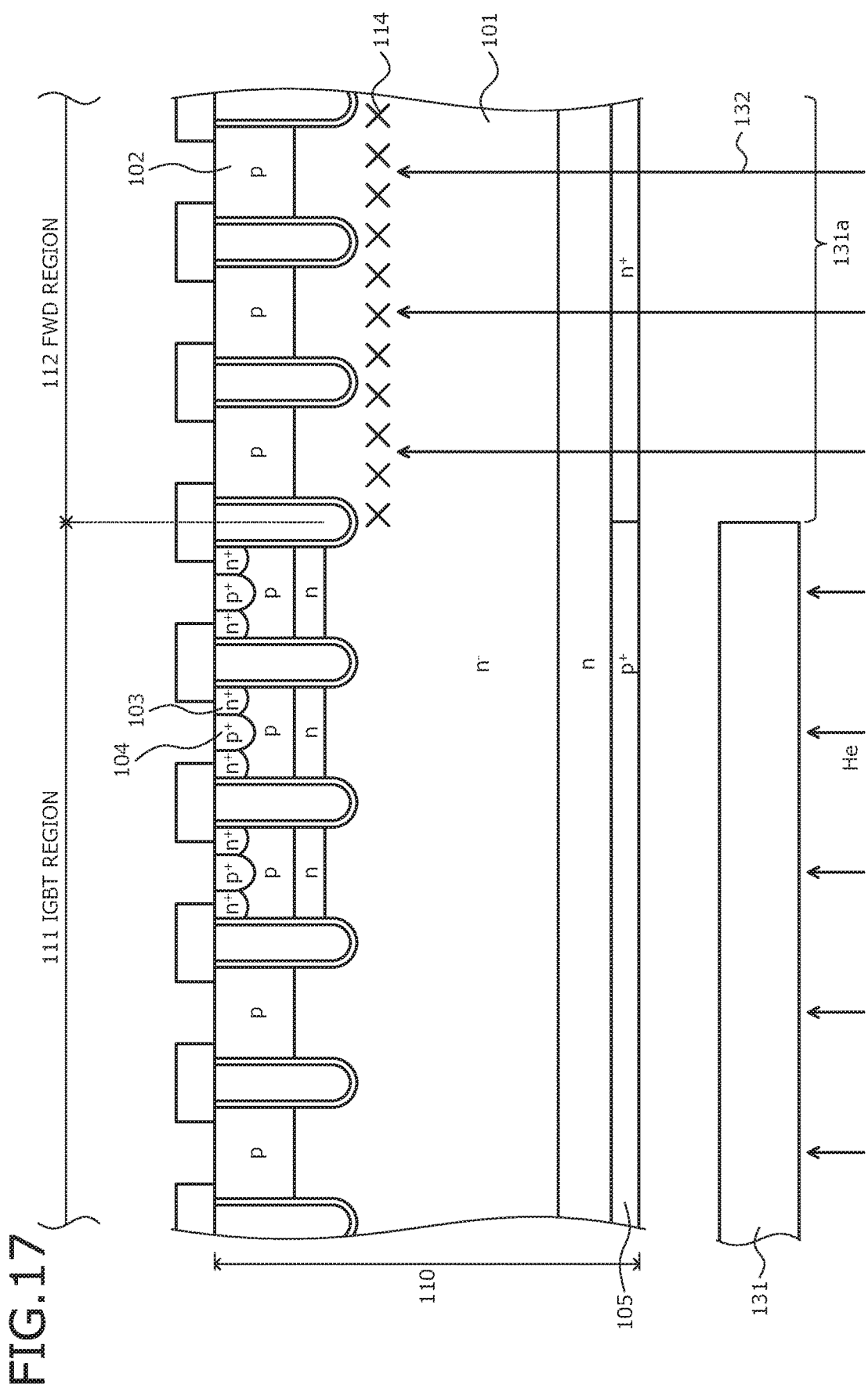
FIG. 17 is a cross-sectional view schematically depicting a state of an ion implantation process using a hard mask as a mask.

Further, at step S101, the photoresist film 121 is formed as a shielding film used at step S106 and is of the required predetermined thickness t101. At step S102, since the part of the photoresist film 121 dissolved by the chemical 144 is sent flying outward and removed by centrifugal force generated by rotation, the semiconductor wafer 110 is rotated at least about twice the revolutions per minute (rpm) of that during the process at step S101. Usually, when the viscosity of the photoresist or the type of the solvent are the same, the thickness t101 of the photoresist film 121 decreases exponentially accompanying increases in the rotational speed of the semiconductor wafer 110 (refer to FIG. 12). FIG. 12 is a characteristics diagram depicting a relationship of rotational speed of the semiconductor wafer and thickness of the photoresist film.

For example, at step S102, the semiconductor wafer 110 is assumed to be rotated at a rotational speed m2 [rpm] or higher, the rotational speed m2 being higher than a rotational speed m1 [rpm] of the semiconductor wafer 110 at step S101 (m1<m2<m3). During the process at step S102, hardness of the photoresist film 121 is substantially equal to that during the process at step S101. Therefore, at step S101, even when the predetermined thickness t101 of the photoresist film 121 is established with the rotational speed m1 [rpm] of the semiconductor wafer 110, at step S102, by increasing the rotational speed of the semiconductor wafer 110 to the rotational speed m2 [rpm], a final thickness t101' of the photoresist film 121 becomes thinner than the predetermined thickness t101 (t101'<t101).

Embodiments of a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 2:
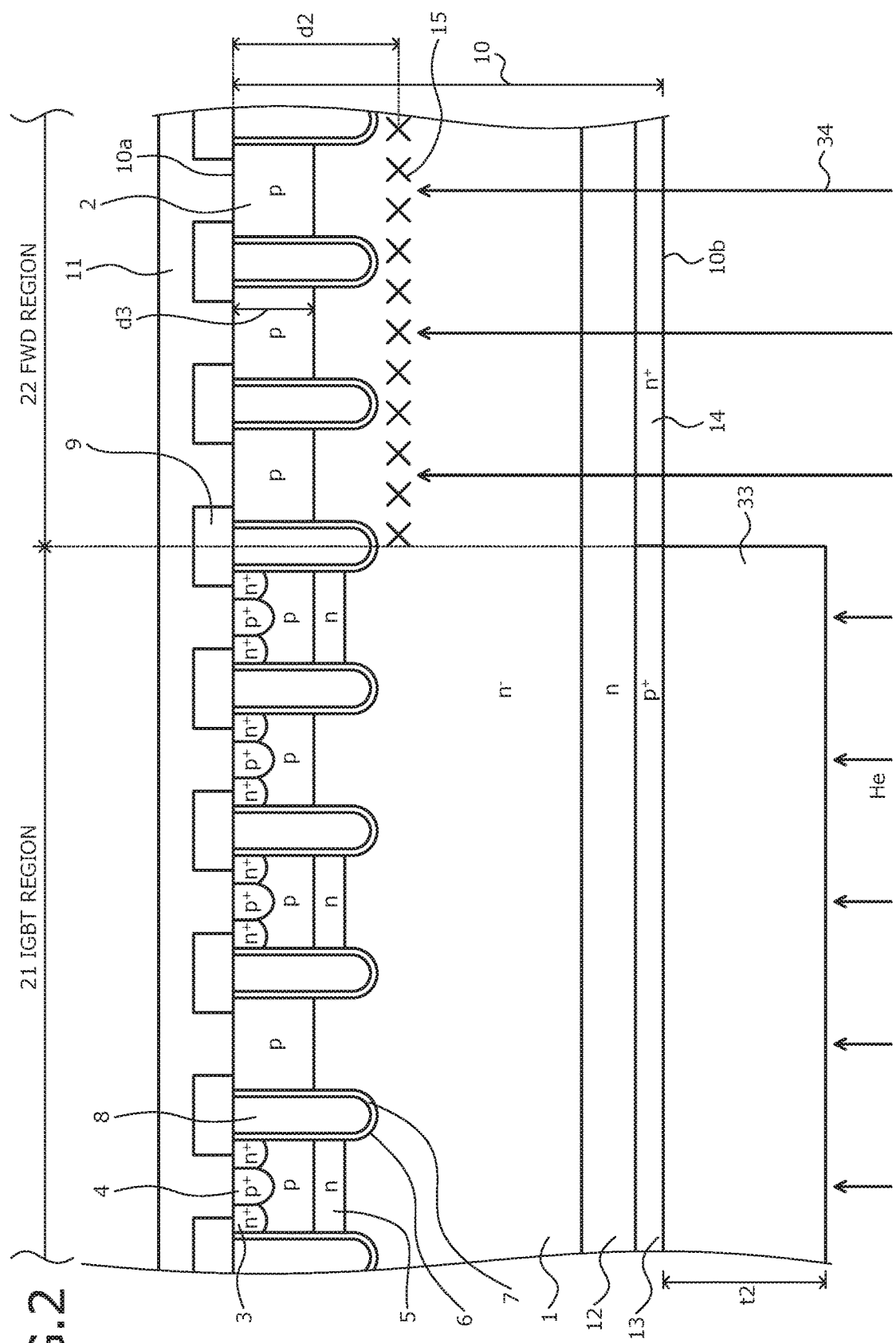
FIG. 2 is a cross-sectional view of another example of the semiconductor device according to the embodiment during manufacture.

A method of manufacturing a semiconductor device according to an embodiment will be described taking as an example, a RC-IGBT having a breakdown voltage of 1200V and in which defects of helium are introduced in a FWD region by helium (He) irradiation. The breakdown voltage is a voltage limit at which errant operation or destruction of an element does not occur. FIG. 1 is a cross-sectional view of the semiconductor device according to the embodiment during manufacture. FIG. 2 is a cross-sectional view of another example of the semiconductor device according to the embodiment during manufacture. FIGS. 1 and 2 respectively depict schematically a state when helium irradiation is performed from a front surface 10a side and from a rear surface 10b side of the semiconductor wafer 10.

The RC-IGBT includes, for example, an IGBT of a trench gate structure and a FWD connected in antiparallel with the IGBT integrated on a single semiconductor substrate (semiconductor chip). In particular, in an active region on the single semiconductor substrate, an IGBT region 21 constituting an operating region of the IGBT and a FWD region 22 constituting an operating region of the FWD are provided in parallel (refer to FIG. 1). The active region is a region in which current flows during an ON state. In an edge termination region (not depicted) surrounding a periphery of the active region, a breakdown voltage structure such as a guard ring or a field plate may be provided.

First, as depicted in FIG. 1, the semiconductor wafer 10 of an n$^-$-type and constituting an n$^-$-type drift region 1 is prepared. A material of the semiconductor wafer 10 may be silicon (Si) or may be silicon carbide (SiC). Hereinafter, a case in which the semiconductor wafer 10 is a silicon wafer will be described as an example. An impurity concentration of the semiconductor wafer 10, for example, may be in range so that resistivity is about 20 Ωcm to 90 Ωcm. The front surface 10a of the semiconductor wafer 10, for example, may be a (001) plane. A thickness (thickness before back grinding described hereinafter) of the semiconductor wafer 10, for example, may be 725 µm.

Next, a process including photolithography and ion implantation as one set is performed repeatedly under differing conditions, forming in the front surface 10a side of the semiconductor wafer 10, a p-type base region 2, an n$^+$-type emitter region 3, and a p$^+$-type contact region 4 of the IGBT. The p-type base region 2 is formed at the active region surface overall, spanning the IGBT region 21 and the FWD region 22. In the FWD region 22, the p-type base region 2, serves as a p-type anode region. In the IGBT region 21, the n$^+$-type emitter region 3 and the p$^+$-type contact region 4 are selectively formed in the p-type base region 2.

A part of the semiconductor wafer 10 excluding the p-type base region 2 as well as an n-type field stop (FS) layer 12, a p$^+$-type collector region 13 and an n$^+$-type cathode region 14 described hereinafter is the n$^-$-type drift region 1. In the IGBT region 21, an n-type accumulation layer 5 may be formed between the n$^-$-type drift region 1 and the p-type base region 2. The n-type accumulation layer 5 is a barrier of minority carriers (holes) of the n$^-$-type drift region 1 at the time of turn ON of the IGBT and has a function of accumulating minority carriers in the n$^-$-type drift region 1.

Next, the front surface 10a of the semiconductor wafer 10 is thermally oxidized, and in the edge termination region, a field oxide film covering the front surface 10a of the semiconductor wafer 10 is formed. Next, by photolithography and etching, in the IGBT region 21, a trench 6 is formed that penetrates the n$^+$-type emitter region 3, the p-type base region 2 and the n-type accumulation layer 5, and reaches the n$^-$-type drift region 1. The trench 6, as viewed from the front surface 10a side of the semiconductor wafer 10, for example, is disposed in a striped layout extending along a direction (viewing direction in FIG. 1) orthogonal to a direction (horizontal direction in FIG. 1) along which the IGBT region 21 and the FWD region 22 are arranged.

Further, the trench 6 is further formed in the FWD region 22, in a layout similar to that in the IGBT region 21. In the FWD region 22, the trench 6 penetrates the p-type base region 2 (p-type anode region) and reaches the n$^-$-type drift region 1. Next, for example, by thermal oxidation, a gate insulating film 7 is formed along an inner wall of the trench 6. Next, a poly-silicon (poly-Si) layer is formed on the front surface 10a of the semiconductor wafer 10, so as to be embedded in the trench 6. Next, the poly-silicon layer, for example, is etched, leaving a part constituting a gate electrode 8 in the trench 6.

The p-type base region 2, the n$^+$-type emitter region 3, the p$^+$-type contact region 4, the trench 6, the gate insulating film 7, and the gate electrode 8 constitute a MOS gate having a trench gate structure. After formation of the gate electrode 8, the n$^+$-type emitter region 3, the p$^+$-type contact region 4 and the n-type accumulation layer 5 may be formed. The n$^+$-type emitter region 3 is disposed in at least one mesa region between adjacent trenches 6 (mesa region). A mesa region in which the n$^+$-type emitter region 3 is not disposed may be present. Further, the n$^+$-type emitter region 3 may be selectively disposed at a predetermined interval along which the trenches 6 extend in a striped shape.

Next, an interlayer insulating film 9 is formed on the front surface 10a of the semiconductor wafer 10, so as to cover the gate electrode 8. Next, the interlayer insulating film 9 is patterned, forming plural contact holes penetrating the interlayer insulating film 9 in a depth direction. The depth direction is a direction from the front surface 10a of the semiconductor wafer 10 toward the rear surface 10b. In a contact hole of the IGBT region 21, the n$^+$-type emitter region 3 and the p$^+$-type contact region 4 are exposed. In a contact hole of the FWD region 22, the p-type base region 2 is exposed.

Next, a front electrode 11 is formed on the interlayer insulating film 9, so as to be embedded in the contact holes. The front electrode 11 is electrically connected with the p-type base region 2, the n$^+$-type emitter region 3 and the p$^+$-type contact region 4 in the IGBT region 21, and functions as an emitter electrode. Further, the front electrode 11 is electrically connected with the p-type base region 2 in the FWD region 22, and functions as an anode electrode. The front electrode 11 may be electrically connected with the p-type base region 2 in a mesa region in which the n$^+$-type emitter region 3 is not disposed.

Next, the semiconductor wafer 10 is ground from the rear surface 10b side (back grinding), and is ground to a position of a project thickness (e.g., about 115 µm) for use as a semiconductor device. When the breakdown voltage is 1200V, the product thickness for use as a semiconductor device, for example, is about 110 µm to 150 µm. Next, a process including photolithography and ion implantation as one set is repeatedly performed under differing conditions, forming on the rear surface 10b side of the semiconductor wafer 10, the n-type field stop (FS: Field Stop) layer 12 and the $n^+$-type cathode region 14.

The $n^+$-type cathode region 14 is formed at a surface layer of the rear surface 10b after the semiconductor wafer 10 is ground and spans the rear surface 10b of the semiconductor wafer 10 overall. The n-type field stop layer 12 is formed at a position deeper from the rear surface 10b of the semiconductor wafer 10 after grinding than is the $n^+$-type cathode region 14. The n-type field stop layer 12 is formed from at least the IGBT region 21 and spans the FWD region 22. The n-type field stop layer 12 may be in contact with the $n^+$-type cathode region 14.

Next, by photolithography and ion implantation, a part of the $n^+$-type cathode region 14 corresponding to the IGBT region 21 is inverted to a $p^+$-type, thereby forming the $p^+$-type collector region 13. In other words, the $p^+$-type collector region 13 is in contact with the $n^+$-type cathode region 14, along the direction along which the IGBT region 21 and the FWD region 22 are arranged. The $p^+$-type collector region 13 may be in contact with the n-type field stop layer 12 along the depth direction. Next, a passivation protection film is formed on the front surface 10a of the semiconductor wafer 10, so as to cover the edge termination region.

Next, on the front surface 10a of the semiconductor wafer 10, a photoresist film 31 is formed having an opening at a part corresponding to the FWD region 22. The photoresist film 31 is used as a mask (shielding film) while helium irradiation 32 of a deep range (e.g., about 8 µm) is performed by high acceleration energy (e.g., about 3.0 eV), introducing (forming) in the $n^-$-type drift region 1, defects 15 of helium constituting a lifetime killer. The defects 15 of helium are introduced near a border of the $n^-$-type drift region 1 with the p-type base region 2 (p-type anode region). An implantation depth (range) d1 of the helium, for example, is about 8 µm from the front surface 10a of the semiconductor wafer 10.

When the implantation depth d1 of the helium is about 8 µm from the front surface 10a of the semiconductor wafer 10, to cause the photoresist film 31 to function as a shielding film, a thickness t1 of the photoresist film 31 is set to be about 33 µm or more as described hereinafter. As a result, the defects 15 are introduced in only the FWD region 22 without the defects 15 being introduced in the IGBT region 21 covered by the photoresist film 31. Conditions of the helium irradiation 32 from the front surface 10a of the semiconductor wafer 10, for example, may be a dose amount in a range from $1\times10^{10}/cm^2$ to $1\times10^{13}/cm^2$ and acceleration energy of about 3.0 MeV to 4.5 MeV.

Further, by an ashing process (ashing), the photoresist film 31 is removed. Detailed description of each process from formation of the photoresist film 31 to the helium irradiation 32 and removal of the photoresist film 31 will be described hereinafter. Next, at the rear surface 10b of the semiconductor wafer 10 overall, a rear electrode (not depicted) is formed. The rear electrode is in contact with the $p^+$-type collector region 13 and the $n^+$-type cathode region 14. The rear electrode functions as a collector electrode and functions as a cathode electrode. Thereafter, the semiconductor wafer 10 is cut (diced) into individual chips, whereby a RC-IGBT chip (semiconductor chip) is completed.

The helium irradiation 32 may be performed before the interlayer insulating film 9 is formed on the front surface 10a of the semiconductor wafer 10. In this case, in the helium irradiation 32, the high acceleration energy is 2.0 MeV or higher and the range is about 8 µm. In this case, the interlayer insulating film 9 is formed on the front surface 10a of the semiconductor wafer 10, after the photoresist film 31 is removed by the ashing process (ashing).

Instead of the helium irradiation 32 from the front surface 10a of the semiconductor wafer 10, helium irradiation 34 from the rear surface 10b of the semiconductor wafer 10 may be performed (refer to FIG. 2). In this case, a photoresist film 33 opened at a part corresponding to the FWD region 22 is formed on the rear surface 10b of the semiconductor wafer 10. The photoresist film 33 is used as a mask (shielding film) and the helium irradiation 34 is performed, introducing in the $n^-$-type drift region 1, the defects 15 of helium constituting a lifetime killer. An implantation depth (range) d2 of the helium, for example, is about 100 µm from the rear surface 10b of the semiconductor wafer 10.

In this manner, when the implantation depth d2 of the helium is about 100 µm from the rear surface 10b of the semiconductor wafer 10, to cause the photoresist film 33 to function as shielding film, a thickness t2 of the photoresist film 33 is set to be about 220 µm or more as described hereinafter. As a result, similarly to the helium irradiation 32 from the front surface 10a of the semiconductor wafer 10, the defects 15 are introduced only in the FWD region 22 and the defects 15 are not introduced in the IGBT region 21 covered by the photoresist film 33. Conditions of the helium irradiation 34 from the rear surface 10b of the semiconductor wafer 10, for example, may be a dose amount of about $1\times10^{10}/cm^2$ to $1\times10^{13}/cm^2$ and acceleration energy of about 10 MeV to 25 MeV.

Figure 4A:
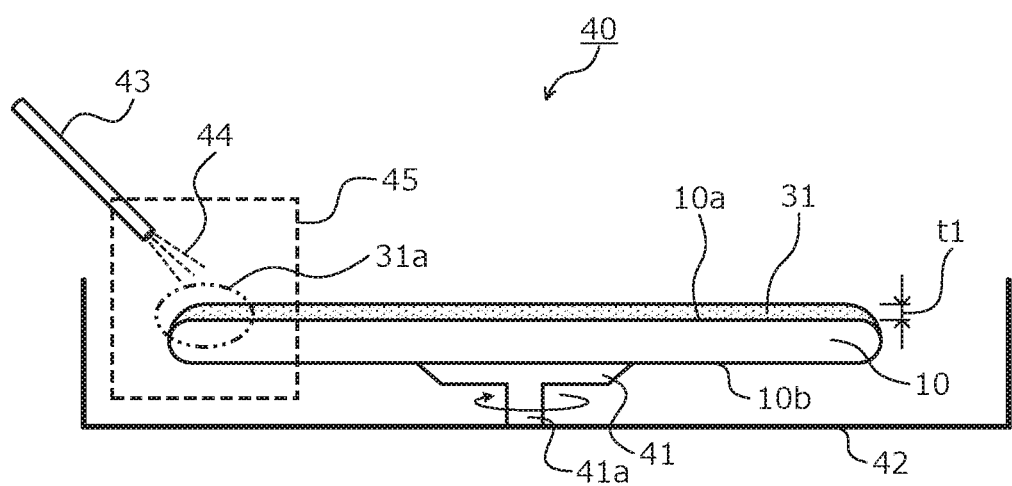
FIG. 4A is a cross-sectional view of the semiconductor device according to the embodiment during manufacture.
Figure 5:
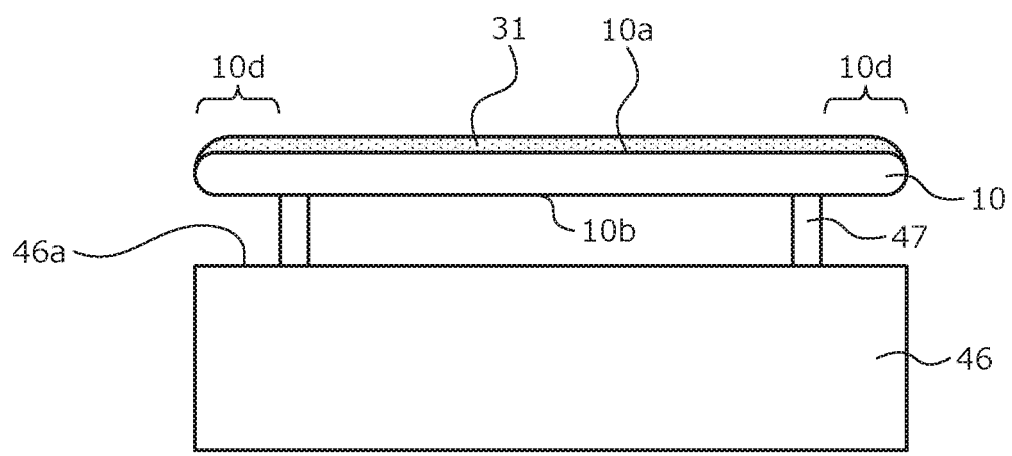
FIG. 5 is a cross-sectional view of the semiconductor device according to the embodiment during manufacture.

Next, processes between the formation and removal of the photoresist film (resist mask) 31 will be described taking a case in which the helium irradiation 32 is performed from the front surface 10a of the semiconductor wafer 10. FIG. 3 is a flowchart depicting an outline of some processes of the method of manufacturing a semiconductor device according to the embodiment. In FIG. 3, the processes performed between the formation and the removal of the photoresist film 31 are depicted in order. FIGS. 4A, 4B, and 5 are cross-sectional views of the semiconductor device according to the embodiment during manufacture. FIGS. 4A and 4B depict a state at step S3 in FIG. 3 and FIG. 5 depicts a state at step S2 in FIG. 3.

First, the semiconductor wafer 10 is placed on a rotating support base 41 of a coater (coating machine) 40 with the rear surface 10b downward (toward the rotating support base 41) and the semiconductor wafer 10 is fixed to the rotating support base 41 by, for example, a vacuum chuck (not depicted) integrated with the rotating support base 41. Next, from a nozzle (not depicted), a photoresist is applied (dripped) on the front surface 10a of the semiconductor wafer 10. The semiconductor wafer 10 is rotated, whereby photoresist spreads on the front surface 10a of the semiconductor wafer 10 overall, forming the photoresist film 31 on the front surface 10a of the semiconductor wafer 10 overall (step S1).

At step S1, the photoresist film 31 is formed of the predetermined thickness t1 required to use the photoresist film 31 as a shielding film in the helium irradiation 32 described hereinafter. The higher the viscosity of the photoresist is, the thicker the thickness t1 of the photoresist film 31 may be made. In establishing the predetermined thickness t1 of the photoresist film 31, the rotational speed [rpm] of the semiconductor wafer 10 is determined according to the viscosity of the photoresist applied to the semiconductor wafer 10 and the type of the solvent included in the photoresist. The rotational speed [rpm] of the semiconductor wafer 10, for example, is controlled by a motive force (=torque×rotational speed) of, for example, a motor (not depicted) that controls the rotational speed [rpm] of the rotating support base 41 fixing the semiconductor wafer 10.

Application of the photoresist may be repeated two or more times to establish the predetermined thickness t1 of the photoresist film 31. Provided the predetermined thickness t1 of the photoresist film 31 is obtained, as a material of the photoresist film 31, any one of a positive type and a negative type photoresist may be used, or a chemically amplified photoresist may be used. A chemically amplified photoresist is a photosensitive material of a mixture of a resin, an acid-generating agent and a solvent, and reacts more easily to light as compared to an ordinary photoresist. The thicker the photoresist film 31 is, the longer exposure takes and therefore, as a material of the photoresist film 31, a chemically amplified photoresist may be used.

Next, the semiconductor wafer 10 is placed on a heating means 46 (refer to FIG. 5) such as a hot plate, having, for example, a heating source, with the rear surface 10b downward (toward the heating means 46). The semiconductor wafer 10 is heated overall (hereinafter, dry bake) by the heating means 46, evaporating the solvent and water in the photoresist film 31, whereby the photoresist film 31 is dried and hardened (step S2). A temperature of the dry bake, for example, may be about 80 degrees C. to 150 degrees C. The transport hand for transporting the semiconductor wafer 10 from a mounting surface of the rotating support base 41 of the coater 40 to a mounting surface 46a of the heating means 46 (or from the heating means 46 described hereinafter to the rotating support base 41 of the coater 40), or in the heating means 46, a transport hand of a shape that does not contact the photoresist film 31 may be used.

For example, as the transport hand, a transport hand may be used that contacts a part of the rear surface 10b of the semiconductor wafer 10 and that is capable of lifting the semiconductor wafer 10 upward, from a face (hereinafter, mounting surface) of the rotating support base 41 (or the heating means 46) on which the semiconductor wafer 10 is placed. In this case, a diameter of the mounting surface of the rotating support base 41 of the coater 40 may be smaller than a diameter (diameter) of the semiconductor wafer 10. As a result, the front surface 10a side of the semiconductor wafer 10 nor the edge part 10c contact the transport hand and therefore, the photoresist film 31 may be prevented from peeling and falling from the semiconductor wafer 10. Additionally, the transport hand and other semiconductor wafers may be prevented from becoming contaminated by the photoresist through the transport hand.

For example, as the heating means 46, a holding part 47 capable of holding the semiconductor wafer 10 at the mounting surface 46a of the heating means 46 may be provided separated from the mounting surface 46a of the heating means 46 (refer to FIG. 5). The holding part 47 contacts a portion of a part that corresponds to an effective region of the rear surface 10b of the semiconductor wafer 10 and the holding part 47 holds the semiconductor wafer 10. The holding part 47, for example, may form a ring-shape having a diameter that is smaller than a diameter of the semiconductor wafer 10, for example. Due to the holding part 47, the rear surface 10b of the semiconductor wafer 10 does not directly contact the mounting surface 46a of the heating means 46. Therefore, even when the photoresist adheres to the rear surface 10b of the semiconductor wafer 10, the mounting surface 46a of the heating means 46 and other semiconductor wafers may be prevented from becoming contaminated by the photoresist through the mounting surface 46a.

Next, the semiconductor wafer 10 is transported from the mounting surface of the heating means 46 to the mounting surface of the rotating support base 41 of the coater 40. With the semiconductor wafer 10 in a state of being rotated, a chemical 44 is dripped on an edge part of the photoresist film 31, a part 31a having a predetermined width w1 from the edge part of the photoresist film 31 is dissolved and removed over the entire periphery of the edge part of the photoresist film 31 (step S3). The chemical 44, for example, is a liquid having a property of dissolving resin such as a thinner. FIG. 4B depicts an enlarged view of a vicinity 45 of the edge part of the photoresist film 31. At step S3, an entire periphery of a peripheral part 10d of the semiconductor wafer 10 is exposed (edge face processing of the semiconductor wafer 10). In other words, the peripheral part 10d of the semiconductor wafer 10 has the width w1 that is substantially equal to that of the part 31a of the photoresist film 31, the part 31a dissolved by the chemical 44.

The peripheral part 10d of the semiconductor wafer 10 is a part constituting an inactive region that is not used as a semiconductor chip. In particular, the peripheral part 10d of the semiconductor wafer 10 is, at step S3 and in processes thereafter, a part sandwiched by the transport hand (not depicted) when the semiconductor wafer 10 is transported, or a part contacting a side wall of a groove (hereinafter, receiving groove) provided in a comb-like shape in an inner wall of a wafer cassette (not depicted). The width w1 of the peripheral part 10d of the semiconductor wafer 10 may be as narrow as possible to broaden the mathematical area of the effective region (region cut out as a semiconductor chip) of the semiconductor wafer 10 used as a semiconductor chip and, for example, is about 6 mm at most. The width w1 is a width along a direction from a center of the semiconductor wafer 10 toward the edge part.

The photoresist film 31 is already hardened by the dry bake at step S2 and therefore, even when the thickness t1 of the photoresist film 31 is thick, at step S3, a shape of an edge face 31b newly exposed of the photoresist film 31 does not collapse. In other words, the photoresist film 31 does not flow out to the peripheral part 10d of the semiconductor wafer 10 and therefore, the entire periphery of the peripheral part 10d of the semiconductor wafer 10 is completely exposed over the predetermined width w1. Therefore, at the processes subsequent to step S3, the photoresist film 31 does not contact the transport hand, the receiving groove of the wafer cassette, a stage of a manufacturing apparatus, or the like. As a result, the generation of particles (fine dust), and contamination of the transport hand, the receiving groove of the wafer cassette, the stage of a manufacturing apparatus, or the like may be prevented.

Further, the rotational speed [rpm] of the semiconductor wafer 10 at step S3 is equal to the rotational speed [rpm] of the semiconductor wafer 10 at step S1, or slower. The thickness t1 of the photoresist film 31 decreases exponentially accompanying increases in the rotational speed of the semiconductor wafer 10 (refer to FIG. 12); however, in this manner, the rotational speed [rpm] of the semiconductor wafer 10 at step S3 is set to 1 or less times the rotational speed [rpm] of the semiconductor wafer 10 at step S1, whereby the thickness t1 of the photoresist film 31 is maintained. In other words, the predetermined thickness t1 determined at step S1 may be secured as the final thickness t1' of the photoresist film 31 (t1'=t1).

On the other hand, when the rotational speed [rpm] of the semiconductor wafer 10 at step S3 is too low and the chemical 44 is partially dripped at the edge part of the photoresist film 31, the chemical 44 cannot be applied uniformly over the entire periphery of the edge part of the photoresist film 31. As a result, when the part 31a of the predetermined width w1 from the edge part of the photoresist film 31 dissolves, the newly exposed edge face 31b has a wavy planar shape as viewed from the front surface 10a side of the semiconductor wafer 10. In other words, at step S3, the entire periphery of the peripheral part 10d of the semiconductor wafer 10 cannot be exposed across the width w1 constantly. Therefore, the rotational speed [rpm] of the semiconductor wafer 10, for example, may be about 0.5 or more times the rotational speed [rpm] of the semiconductor wafer 10 at step S1.

The coater 40 used at step S3 may be the same coater 40 used at step S1 (i.e., the coater 40 common to steps S1 and S3 is prepared), or may be the coater 40 different from that at step S1 (i.e., the coater 40 dedicated for step S1 and the coater 40 dedicated for step S3 are prepared). When the coater 40 common to steps S1 and S3 is used, the cost for equipment may be reduced. When the coater 40 dedicated for step S1 and the coater 40 dedicated for step S3 are prepared, the throughput may be enhanced. Reference character 41a is a rotation axis that propagates the motive force of the motor to the rotating support base 41. Reference numeral 42 is a cup (outer ring) of the coater 40 and reference numeral 43 is the nozzle that ejects the chemical 44.

Next, the semiconductor wafer 10 on which the photoresist film 31 is formed is transported from the coater 40 to the stage of the stepper (exposure apparatus: not depicted). At this time, for example, at the peripheral part 10d of the semiconductor wafer 10, the semiconductor wafer 10 is pinched by the transport hand such that both surfaces of the semiconductor wafer 10 are sandwiched and the semiconductor wafer 10 is stored in the wafer cassette (not depicted), and the semiconductor wafers 10 that have been stored in the wafer cassette are collectively transported. As a result, at the exposure process described hereinafter, the semiconductor wafers 10 may be successively processed. Therefore, the operating time of the stepper, which has high operating costs, may be shortened, enabling cost reductions.

Next, by the stepper, exposure of each chip is performed through a mask (reticle) while the entire surface of each semiconductor wafer 10 is scanned, whereby a predetermined mask pattern is transferred to the photoresist film 31 (step S4). Next, after post exposure bake (PEB), by a developer (developing machine), predetermined sites of the photoresist film 31 are dissolved, developing the pattern, and a part of the photoresist film 31 corresponding to the FWD region 22 is opened (step S5). Next, the helium irradiation 32 is performed from the front surface 10a of the semiconductor wafer 10 using the photoresist film 31 as a mask (step S6).

Figure 6:
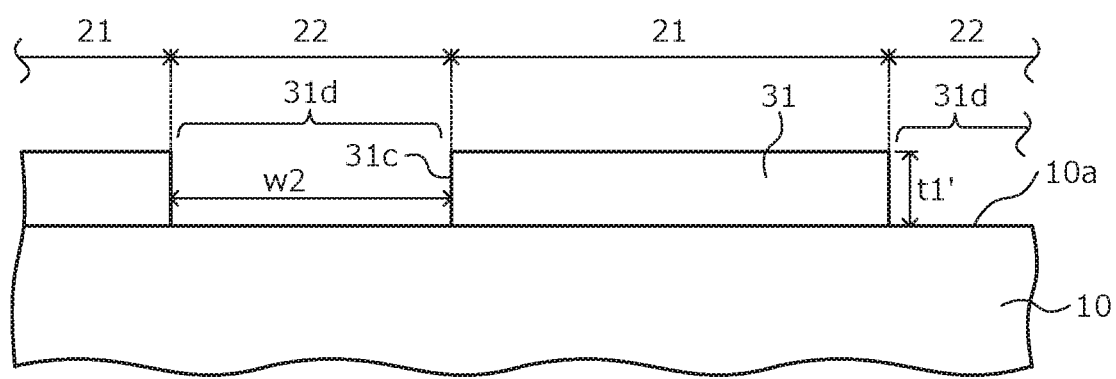
FIG. 6 is a cross-sectional view of a photoresist film after processing at step S5 in FIG. 3.
Figure 7:
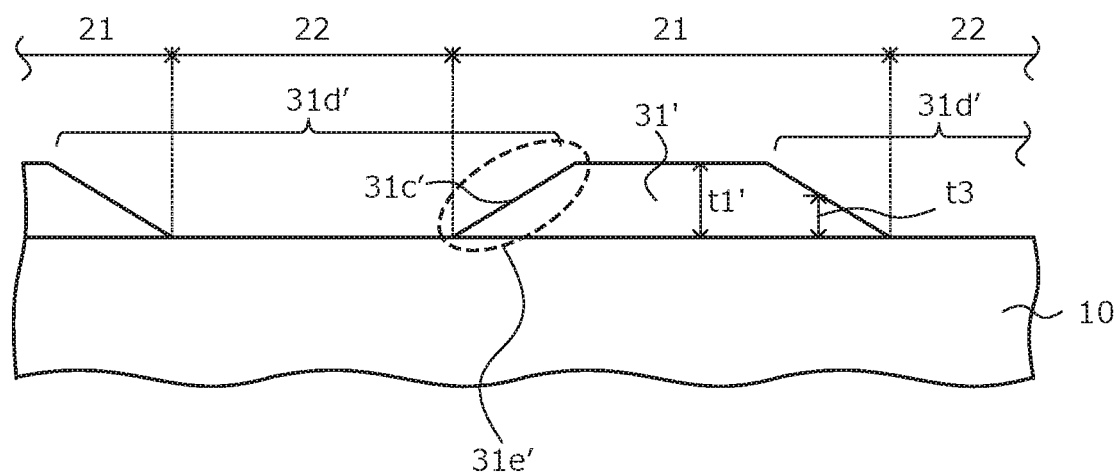
FIG. 7 is a cross-sectional view of a photoresist film of a comparison example.

Here, when a positive-type photoresist is used as a material of the photoresist film 31, between step S5 and step S6, UV curing or post-bake like that of a conventional technique (refer to step S105 in FIG. 10) is not performed. A reason for this is as follows. FIG. 6 is a cross-sectional view of the photoresist film after processing at step S5 in FIG. 3. FIG. 7 is a cross-sectional view of a photoresist film of a comparison example. After step S5, in the pattern, an edge face 31c of the photoresist film 31 is in a substantially perpendicular state with respect to the front surface 10a of the semiconductor wafer 10, and the thickness t1' thereof is substantially uniform (FIG. 6). In the pattern, the edge face 31c of the photoresist film 31 is a side face of the photoresist film 31 exposed at an opening 31d of the pattern.

On the other hand, when UV curing or post-bake is performed between step S5 and step S6, and the thickness t1' of the photoresist film 31' is thick, in the pattern, an edge part 31e' of the photoresist film 31' becomes deformed. The higher the temperature of the UV curing or post-bake becomes, an upper end side of the opening 31d' widens and in the pattern, the edge face 31c' of the photoresist film 31' becomes inclined, whereby a thickness t3 of the edge part 31e' of the photoresist film 31' in the pattern becomes thin (t3<t1') (refer to FIG. 7).

During the helium irradiation 32, helium penetrates through a part where the thickness t3 of the edge part 31e' of the photoresist film 31' in the pattern is thin. Therefore, helium is introduced in a part (part opposing in the depth direction) of the semiconductor wafer 10 directly beneath the edge part 31e' of the photoresist film 31' in the pattern, whereby gate threshold of the IGBT varies and leak current increases. Further, when a large design margin of the IGBT region 21 is taken so that an element structure of the IGBT is not disposed directly beneath the edge part 31e' of the photoresist film 31' in the pattern, the chip size increases.

In this manner, when a positive-type photoresist is used as a material of the photoresist film 31, UV curing and post-bake are not performed between step S5 and step S6, enabling the pattern shape of the photoresist film 31' after step S5 to be maintained. On the other hand, when UV curing and post-bake are not performed, the surface of the photoresist film 31 is altered during the helium irradiation 32 and at the asking process thereafter, the photoresist film 31 becomes difficult to remove. Therefore, conditions of the helium irradiation 32 include a dose amount and an acceleration energy set so that the photoresist film 31 is not altered. In particular, conditions of the helium irradiation 32, for example, include a dose amount of $1 \times 10^{15}/cm^2$ or less, and acceleration energy of 5 MeV or less. In this manner, the acceleration energy of the helium irradiation 32 is suppressed, whereby the surface of the photoresist film 31 may be prevented from becoming altered during the helium irradiation 32.

FIG. 8 is a characteristics diagram depicting a relationship of helium implantation depth and thickness of the photoresist film. FIG. 8 depicts the thickness t1' required for shielding by the photoresist film 31 in the helium irradiation 32 performed at the implantation depth d1. In FIG. 8, an "○" mark indicates that shielding is possible and an "x" mark indicates that the thickness t1 of the photoresist film 31' is insufficient and shielding is not possible (i.e., helium penetrates through the photoresist film 31 and is introduced in the semiconductor wafer 10). As described above, when a positive-type photoresist is used as a material of the photoresist film 31, the acceleration energy of the helium irradiation 32 is suppressed to 5 MeV or less as described above and therefore, a maximum value of the implantation depth d1 of the helium is about 30 μm. In other words, when a positive-type photoresist is used as a material of the photoresist film 31, the thickness t1 of the photoresist film 31' is set to be about 66 μm at most (part encompassed by bold-lined frame in FIG. 8). When the implantation depth d1 of the helium is about 8 μm or less, the thickness t1 of the photoresist film 31' may be set to be about 33 μm or less.

When a negative-type photoresist is used as a material of the photoresist film 31, the described problems of the positive-type photoresist do not occur and therefore, UV curing or post-bake like that of a conventional technique may be performed between step S5 and step S6. Therefore, conditions of the dose amount and acceleration energy of the helium irradiation 32 need not be suppressed, the thickness t1 of the photoresist film 31' may be thick, and the helium irradiation 32 of a deep range may be performed. However, at the asking process thereafter, the photoresist film 31 becomes difficult to remove. Further, in the case of a negative-type photoresist, a highly corrosive, specialized removing solution is necessary. The front electrode may be dissolved by this removing solution, or cracks may form in the passivation protection film. Therefore, the thickness t1 of the photoresist film 31' may be determined to be of a magnitude enabling such problems to be avoided.

Although not depicted, for example, when the thickness t1 of the photoresist film 31' is 220 μm, the implantation depth d1 of the helium may be made deep, up to about 100 μm. When the implantation depth d1 of the helium is about 75 μm or less, the thickness t1 of the photoresist film 31' may be made about 165 μm or less. Further, as depicted in FIG. 8, when the implantation depth d1 of the helium is about 50 μm or less, the thickness t1 of the photoresist film 31' may be made about 110 μm or less. When the implantation depth d1 of the helium is about 30 μm or less, the thickness t1 of the photoresist film 31' may be made about 66 μm or less. When the implantation depth d1 of the helium is about 8 μm or less, the thickness t1 of the photoresist film 31' may be made about 33 μm or less.

In the RC-IGBT, as described above, the defects 15 are formed near the interface of the n⁻-type drift region 1 and the p-type base region 2 by the helium irradiation 32 (refer to FIG. 1). Therefore, when the helium irradiation 32 is performed from the front surface 10a of the semiconductor wafer 10, the thickness t1 of the photoresist film 31' is relatively thin. Therefore, a material of the photoresist film 31 may be a positive or a negative photoresist. Further, a minimum processing dimension of a width w2 of the opening 31d of the photoresist film 31 is equal to the thickness t1 of the photoresist film 31'. Since the thickness t1 of the photoresist film 31' is relatively thin, the minimum processing dimension of the width w2 of the opening 31d of the photoresist film 31 decreases, whereby a reduction in the size of the semiconductor chip is possible. Thereafter, by the ashing process, the photoresist film 31 is removed (step S7), whereby a series of processes for performing the helium irradiation 32 is completed.

Even when the photoresist film 33 is used as a mask and the helium irradiation 34 is performed with respect to the FWD region 22 from the rear surface 10b of the semiconductor wafer 10 (refer to FIG. 2), the described series of processes for performing the helium irradiation 32 from the front surface 10a of the semiconductor wafer 10 (refer to FIGS. 3 to 5) are applicable. In this case, when the helium irradiation 34 is performed with respect to the FWD region 22 from the rear surface 10b of the semiconductor wafer 10, the thickness t2 of the photoresist film 33 becomes relatively thin and therefore, a negative-type photoresist is used as a material of the photoresist film 33.

As described above, according to the embodiment, use of the resist mask in the ion implantation by a high acceleration energy enables the minimum processing dimension of the mask opening to be small as compared to when a hard mask is used and the alignment precision with the semiconductor wafer may be enhanced. In particular, compared to about 300 μm, which is the minimum processing dimension of the opening of the hard mask, the minimum processing dimension of the opening of the resist mask is about equal to the thickness of the resist mask and at most is about 220 μm. Further, alignment precision of the semiconductor wafer and the hard mask is about ±50 μm, whereas the alignment precision of the semiconductor wafer and resist mask is about ±1.5 μm. As a result, a predetermined impurity may be implanted in a predetermined region with good positioning accuracy. Further, the design margin may be reduced at the time of device design, whereby the chip size may be reduced. As a result, the number of chips that may be cut out from one semiconductor wafer increases, enabling the product price to be reduced and costs to be reduced.

Further, according to the embodiment, the minimum processing dimension of the opening of the resist mask may be reduced, whereby in the fabrication of the RC-IGBT having the structure in which the IGBT and the FWD are integrated and built on a single semiconductor chip, the degrees of freedom in disposal of the IGBT region and the FWD region increases. For example, in the RC-IGBT, the IGBT and the FWD alternately operate. Therefore, a region in which heat is generated due an element being in the ON state and a region at a relatively low temperature due to an element being in the OFF state exist concurrently in a single semiconductor chip, whereby the region at the lower temperature functions as a cooler. Therefore, by increasing the degrees of freedom in the disposal of the IGBT region and the FWD region, the IGBT region of a small mathematical area and the FWD region may be alternately disposed, enabling the heat generation of the semiconductor chip itself to be further suppressed.

Further, according to the embodiment, before the edge part of the photoresist film is dissolved by a chemical (edge face processing of the semiconductor wafer), the photoresist film is dry baked, whereby even when the thickness of the photoresist film is thick, the shape of the edge face of the photoresist film does not collapse, enabling edge face processing of the semiconductor wafer to be performed. Therefore, generation of particles, contamination of the transport hand, the receiving groove of the wafer cassette and the stage of manufacturing apparatus, etc. may be prevented. Further, according to the embodiment, the rotational speed of the semiconductor wafer during the edge face processing of the semiconductor wafer is set to be equal to the rotational speed of the semiconductor wafer during the photoresist application or less, whereby the thickness of the photoresist film determined during the photoresist application may be maintained even after the edge face processing of the semiconductor wafer.

Further, according to the embodiment, UV curing and post-bake are not performed between the development of the photoresist film and the helium irradiation, whereby the edge part of the pattern of the photoresist film does not changed. Therefore, the helium irradiation may be performed in only a predetermined part (i.e., the FWD region when the RC-IGBT is fabricated) of the semiconductor wafer with good positioning accuracy. Further, according to the embodiment, in the fabrication of the RC-IGBT, helium is introduced only in the FWD region and therefore, the dose amount of the helium irradiation needs not be suppressed and the loss reduction effect may be enhanced. Further, according to the embodiment, in the fabrication of the RC-IGBT, helium is not introduced in the IGBT region and therefore, increases in leak current in the IGBT region may be prevented.

In the present invention, without limitation to the embodiment, various modifications not departing from the spirit of the present invention are possible. For example, in the described embodiment, while a case in which helium is irradiated is described as an example, without limitation hereto, when ion implantation of a predetermined impurity is performed by a high acceleration energy (e.g., a range of 8 μm or higher) of, for example, 1.5 MeV or higher, or when the thickness of the photoresist film used as a resist mask (shielding film) is, for example, about 30 μm or higher, the present invention is applicable. Further, in the described embodiment, while a RC-IGBT is described as an example, without limitation hereto, the present invention is further applicable to devices of various structures for which proton irradiation or helium irradiation of a high acceleration energy, or ion implantation of an impurity is performed by the above conditions. Further, dimensions, impurity concentrations, etc. of regions are variously set according to required specifications. The present invention is similarly implemented when conductivity types (n-type, p-type) are reversed.

(Experiment) In the described embodiments above, lower limit values of the thicknesses of the photoresists (resist masks) in a case in which the helium irradiations 32, 34 depicted in FIGS. 1 and 2 are performed are indicated. Function as a resist mask (shielding film) is enhanced the greater are the thicknesses t1, t2 of the photoresist films 31, 33 and thus, ion implantation of a predetermined impurity is not limited to helium and may be, for example, protons when performed by a high acceleration energy.

Nonetheless, warpage of the semiconductor wafer 10 occurs more easily with increasing thicknesses t1, t2 of the photoresist films 31, 33. Further, warpage of the semiconductor wafer 10 is greatest at a peripheral end of the semiconductor wafer 10 and also increases with decreasing thickness of the semiconductor wafer 10.

The greater is the warpage of the semiconductor wafer 10, the more easily cracks and chips may occur in the semiconductor wafer 10 when the semiconductor wafer 10 is transported between manufacturing processes, is placed in a manufacturing apparatus, or is placed and fixed therein. Further, as a result of cracks or chips occurring in the semiconductor wafer 10, particles are generated, whereby the surrounding environment or a manufacturing apparatus used in a manufacturing process becomes contaminated and the yield of the individual semiconductor devices obtained from the semiconductor wafer 10 decreases.

Hereinafter, in an example of a case in which the helium irradiation 32 is performed from the front surface 10a of the semiconductor wafer 10, a mechanism by which warpage of the semiconductor wafer 10 occurs during the processes from the formation of the photoresist film 31 (resist mask) to the removal thereof outlined in the flowchart depicted in FIG. 3 will be described with reference to FIGS. 3, 9A to 9C.

Figure 9A:
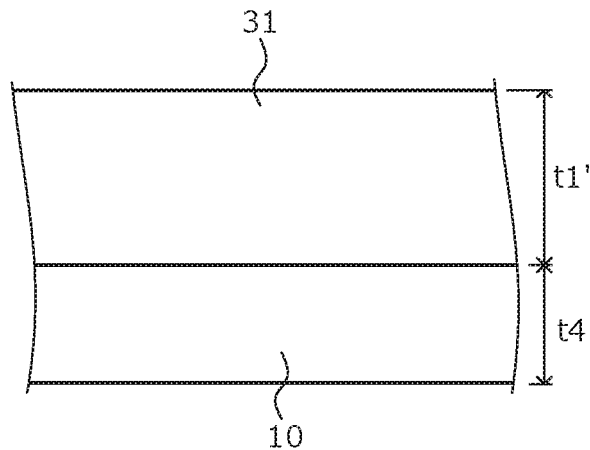
FIG. 9A is a cross-sectional view of a semiconductor wafer and the photoresist film after processing at step S1.

FIG. 9A is a cross-sectional view of the semiconductor wafer 10 and the photoresist film 31 after the process of "forming the photoresist film 31 on the front surface 10a of the semiconductor wafer 10 overall" at step S1. In FIG. 9A, the thickness of the photoresist film 31 is indicated as t1' while the thickness of the semiconductor wafer is indicated as t4 (similarly in FIGS. 9B and 9B).

Figure 9B:
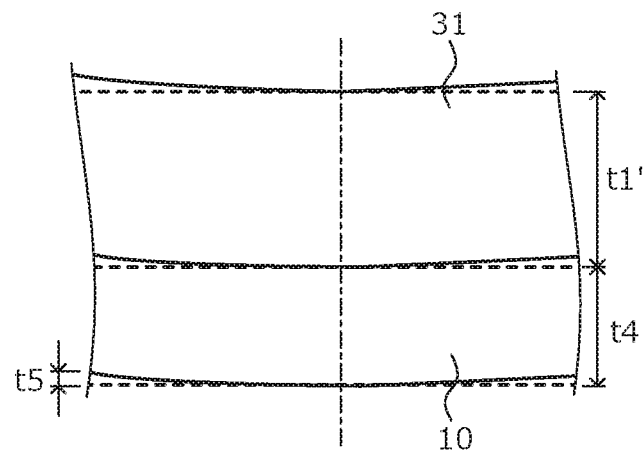
FIG. 9B is a cross-sectional view of the semiconductor wafer and the photoresist film after processing at steps S2 and S3.

FIG. 9B is a cross-sectional view of the semiconductor wafer 10 and the photoresist film 31 after the process of "evaporating the solvent and water in the photoresist film 31, whereby the photoresist film 31 is dried and hardened" at step S2 and the process in which "the edge part of the photoresist film 31 is dissolved and removed over the entire periphery of the edge part of the semiconductor wafer 10" at step S3. A dashed line in FIG. 9B is a central axis orthogonal to the front surface 10a of the semiconductor wafer 10.

As depicted in FIG. 9B, in the process as step S2, solvent and water in the photoresist film 31 are evaporated, whereby the photoresist film 31 that is formed on the semiconductor wafer 10 contracts, thereby generating stress. Warpage t5 of the semiconductor wafer 10 occurs as a result of this stress. The warpage t5 of the semiconductor wafer 10 increases as the thickness t1' of the photoresist film 31 increases and as the thickness t4 of the semiconductor wafer 10 decreases. Furthermore, the warpage t5 of the semiconductor wafer 10 is greatest at the peripheral end (not depicted) of the semiconductor wafer 10.

Figure 9C:
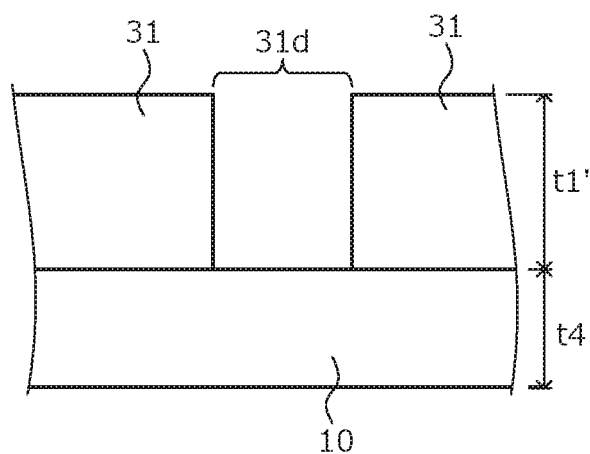
FIG. 9C is a cross-sectional view of the semiconductor wafer and the photoresist film after processing at step S5.

FIG. 9C is a cross-sectional view of the semiconductor wafer 10 and the photoresist film 31 after the process of "forming the opening 31d of the photoresist film 31 by developing the photoresist film 31 after exposure" at step S5. As depicted in FIG. 9C in the process at step S5, the opening 31d of the photoresist film 31 is formed in the photoresist film 31, whereby the stress due to the contraction of the photoresist film 31 is mitigated. As a result, in the process at step S2, the warpage t5 of the semiconductor wafer 10 is reduced.

Between the processes at steps S1 to S5, the semiconductor wafer 10 has to be transported, the semiconductor wafer 10 has to be placed at a predetermined position in a predetermined manufacturing apparatus or has to be placed and fixed at a predetermined position in a predetermined manufacturing apparatus in order to perform each of the processes. As described above, when the warpage t5 of the semiconductor wafer 10 has occurred (refer to FIG. 9B) and the semiconductor wafer 10 is placed and fixed at a predetermined position in a predetermined manufacturing apparatus, cracks and chips easily occur in the semiconductor wafer 10.

Of the processes at each of the steps in the flowchart depicted in FIG. 3, cracks and chips occur most easily in the semiconductor wafer 10 during the process of "transferring a predetermined mask pattern to the photoresist film 31 by exposure" at step S4. In the process at step S4, the semiconductor wafer 10 in which the warpage t5 has occurred is placed on a stage in a stepper apparatus and a surface where the semiconductor wafer 10 is in contact with the stage is fixed thereto by suction.

Here, the processes at each of the steps in the flowchart depicted in FIG. 3 were performed under conditions in which the thickness t4 of the semiconductor wafer 10 was 120 μm and the thickness t1' of the photoresist film 31 was 180 μm. Here, the warpage t5 at the peripheral end of the semiconductor wafer 10 after the process at step S3 was at most 2 mm and in the processes after the process at step S3, cracks and chips in the semiconductor wafer 10 were able to be suppressed.

Therefore, by setting the thickness t1' of the photoresist film 31 to be at most 1.5 times (t1'≤1.5×t4) of the semiconductor wafer 10, even when the warpage t5 occurs at the peripheral end of the semiconductor wafer 10 and the semiconductor wafer 10 is placed and fixed at a predetermined position in a predetermined manufacturing apparatus, it is possible to suppress cracks and chips in the semiconductor wafer 10. As a result, in the processes at the steps in the flowchart depicted in FIG. 3, it is possible to suppress an occurrence of the problem in which particles are generated, whereby a manufacturing apparatus becomes contaminated and yield decreases.

In the described embodiments, while a RC-IGBT has been described as an example, without limitation hereto, the present invention is further applicable to devices of various structures for which proton irradiation or helium irradiation of a high acceleration energy, or ion implantation is performed.

According to the described invention, by using a resist mask, as compared to a case of using a hard mask, a minimum processing dimension of a mask opening may be reduced and alignment precision with the semiconductor wafer may be enhanced. Further, since the design margin may be reduced at the time of device design, the chip size may be reduced. Therefore, the number of chips that may be cut out from one semiconductor wafer may be increased.

According to the method of manufacturing a semiconductor device of the present invention an effect is achieved in that, using a photoresist film as a mask, a predetermined impurity may be implanted in a predetermined region with good positioning accuracy and costs may be reduced.

As described, the method of manufacturing a semiconductor device according to the present invention is useful for semiconductor devices for which ion implantation has to be performed by a high acceleration energy.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
   applying a photoresist to a first main surface of a semiconductor wafer and forming a photoresist film, the photoresist film having a thickness along the first main surface of the semiconductor wafer which is at most 1.5 times the thickness of the semiconductor wafer;
   drying the photoresist film by heat treatment after forming the photoresist film;
   dissolving and removing by a chemical, a part having a predetermined width from an edge part of the photoresist film, the part being dissolved and removed over an entire periphery of the edge part of the photoresist film, after drying the photoresist film;
   opening a predetermined site of the photoresist film and forming a resist mask, after drying the photoresist film; and
   using the resist mask as a mask, and performing ion implantation of an impurity by an acceleration energy so that a range is at least 8 μm from the first main surface of the semiconductor wafer.

2. The method according to claim 1, wherein
   forming the photoresist film includes forming the photoresist film to have the thickness by spreading the photoresist on the first main surface of the semiconductor wafer overall by rotating the semiconductor wafer around a central axis at a predetermined rotational speed, the central axis being orthogonal to the first main surface of the semiconductor wafer, and
   dissolving and removing the part includes dripping the chemical on the edge part of the photoresist film while the semiconductor wafer is rotated around the central axis at a rotational speed that is the predetermined rotational speed or slower, and applying the chemical over the entire periphery of the edge part of the photoresist film.

3. The method according to claim 1, wherein
   the thickness of the photoresist film is 110 μm or more.

4. The method according to claim 1, wherein
   the thickness of the semiconductor wafer is 110 μm to 150 μm.

5. The method according to claim 1, wherein
   the acceleration energy of the ion implantation is 3.0 MeV or higher.

6. The method according to claim 1, wherein
   the impurity is helium.

7. The method according to claim 6, wherein
   a dose amount of the ion implantation is $1\times10^{15}/cm^2$ or less,
   the acceleration energy of the ion implantation is 5 MeV or less, and
   performing the ion implantation is performed after forming the resist mask without an interposed process in between.

8. The method according to claim 7, wherein
   forming the resist mask includes:
      transferring and exposing a predetermined mask pattern to the photoresist film, and
      developing by selectively dissolving the photoresist film based on the mask pattern and opening the predetermined site of the photoresist film, and
   wherein
   performing the ion implantation is performed after the developing, without an interposed process in between.

9. The method according to claim 1, wherein
   the impurity is protons.

10. The method according to claim 1, wherein
   the photoresist used is chemically amplified.

11. The method according to claim 1, further comprising forming a first semiconductor element in a first region of the semiconductor wafer and forming a second semiconductor element in a second region of the semiconductor wafer,
   wherein
   the predetermined site of the photoresist film is a site that corresponds to a formation region of the second region.

12. The method according to claim 11, wherein
   the first semiconductor element is an insulated-gate bipolar transistor,
   the second semiconductor element is a diode,
   forming the first semiconductor element and forming the second semiconductor element include forming in a surface layer of the first main surface of the semiconductor wafer of a first conductivity type, a second-conductivity-type semiconductor region constituting a base region of the insulated-gate bipolar transistor and an anode region of the diode, and
   performing the ion implantation includes implanting the impurity near an interface of the semiconductor wafer with the second-conductivity-type semiconductor region, from the first main surface of the semiconductor wafer.

13. The method according to claim 12, wherein
   forming the first semiconductor element and forming the second semiconductor element includes forming an interlayer insulating film on the first main surface of the semiconductor wafer, and
   performing the ion implantation is performed before forming the interlayer insulating film.

14. The method according to claim 11, wherein
   the first semiconductor element is an insulated-gate bipolar transistor,
   the second semiconductor element is a diode, forming the first semiconductor element and forming the second semiconductor element includes forming in a surface layer of a second main surface of the semiconductor wafer of a first conductivity type, a second-conductivity-type semiconductor region constituting a base region of the insulated-gate bipolar transistor and an anode region of the diode, and performing the ion implantation includes implanting the impurity near an interface of the semiconductor wafer with the second-conductivity-type semiconductor region, the impurity being implanted from the first main surface of the semiconductor wafer.

15. The method according to claim 1, wherein
the photoresist used is a positive-type.

16. The method according to claim 1, wherein
the photoresist used is a negative type.

17. The method according to claim 1, wherein
forming the photoresist film includes forming the photoresist film to have the thickness by spreading the photoresist on the first main surface of the semiconductor wafer overall by rotating the semiconductor wafer around a central axis at a predetermined rotational speed, the central axis being orthogonal to the first main surface of the semiconductor wafer, and dissolving and removing by the chemical, the part having the predetermined width from the edge part of the photoresist film, includes dripping the chemical on the edge part of the photoresist film while the semiconductor wafer is rotated around the central axis at the predetermined rotational speed, and applying the chemical over the entire periphery of the edge part of the photoresist film.

18. The method according to claim 1, wherein
opening the predetermined site of the photoresist film and forming the resist mask includes:
    transferring and exposing a predetermined mask pattern to the photoresist film, and
    selectively dissolving the photoresist film based on the predetermined mask pattern and opening the predetermined site of the photoresist film,
wherein ultraviolet curing or a baking process is not performed between the selectively dissolving and performing the ion implantation.

19. The method according to claim 18, wherein
after selectively dissolving the photoresist film based on the predetermined mask pattern, an edge face of the photoresist film is in a substantially perpendicular state with respect to the front surface of the semiconductor wafer, and the thickness of the photoresist film is substantially uniform.

* * * * *